(12) United States Patent
Yamazaki et al.

(10) Patent No.: US 6,531,993 B1
(45) Date of Patent: Mar. 11, 2003

(54) ACTIVE MATRIX TYPE DISPLAY DEVICE

(75) Inventors: Shunpei Yamazaki, Tokyo (JP); Jun Koyama, Kanagawa (JP); Satoshi Murakami, Kanagawa (JP); Yukio Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/515,682

(22) Filed: Feb. 29, 2000

(30) Foreign Application Priority Data

Mar. 5, 1999 (JP) .......................................... 11-059455

(51) Int. Cl.[7] .................................................. G09G 3/20
(52) U.S. Cl. .............................. 345/55; 345/87; 345/92; 345/96; 345/98; 345/100; 345/90; 345/206; 349/42; 349/43; 349/45; 257/59; 257/72; 257/347; 257/350; 257/351
(58) Field of Search .............................. 345/55, 92, 98, 345/100, 87, 90, 96, 206; 349/42, 43, 45; 257/59, 72, 347, 350, 351

(56) References Cited

U.S. PATENT DOCUMENTS

| | | |
|---|---|---|
| 5,499,123 A | 3/1996 | Mikoshiba |
| 5,748,165 A | 5/1998 | Kubota et al. |
| 5,844,538 A | 12/1998 | Shiraki et al. |
| 5,959,599 A | 9/1999 | Hirakata |
| 5,966,193 A | 10/1999 | Zhang et al. |
| 6,013,930 A | 1/2000 | Yamazaki et al. |
| 6,104,461 A | 8/2000 | Zhang et al. |
| 6,121,660 A | 9/2000 | Yamazaki et al. |
| 6,219,113 B1 * | 4/2001 | Takahara ..................... 345/98 |
| 6,278,131 B1 | 8/2001 | Yamazaki et al. |
| 6,323,515 B1 | 11/2001 | Yamazaki et al. |
| 6,335,716 B1 | 1/2002 | Yamazaki et al. |

* cited by examiner

Primary Examiner—Richard Hjerpe
Assistant Examiner—Ali Zamani
(74) Attorney, Agent, or Firm—Eric J. Robinson; Robinson Intellectual Property Law Office, P.C.

(57) ABSTRACT

An active matrix type display device comprising:
  a substrate;
  a plurality of source signal lines and a plurality of gate signal lines formed over the substrate;
  a plurality of pixel TFTs formed over the substrate;
  a plurality of pixel electrodes electrically connected to said plurality of pixel TFTs;
  a shielding film (black matrix) formed over said substrate wherein said shielding film is floating; and
  a dielectric interposed between said pixel electrodes and said shielding film,
  wherein signals whose polarity is inverted per each of said plurality of source signal lines are applied to said source signal lines and the polarity of said signal applied to the respective one of said plurality of source signal lines is inverted per one frame period. It is preferable to form acoupling capacitor between the shielding film and a common electrode.

28 Claims, 31 Drawing Sheets

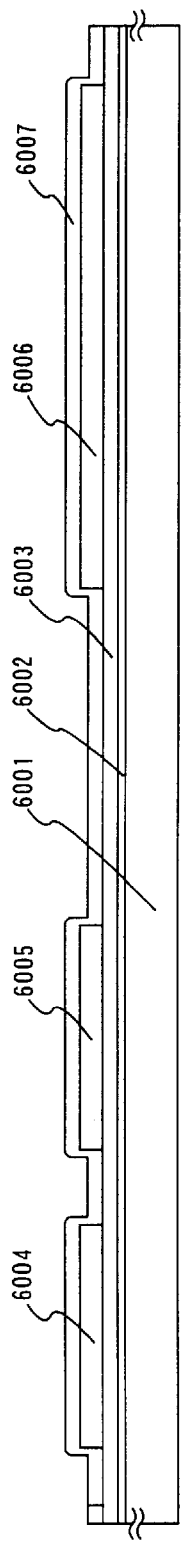
Fig. 8A (Formation of island semiconductor layer and gate insulating film)
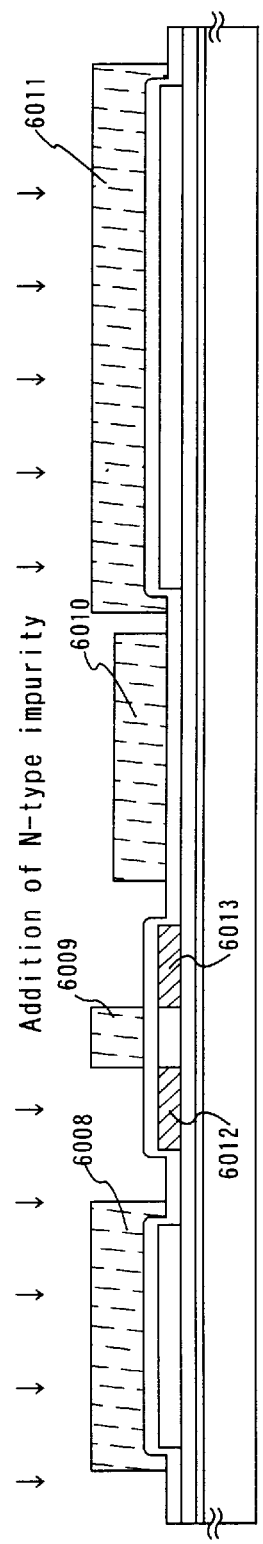
Fig. 8B (Formation of n⁻-region)
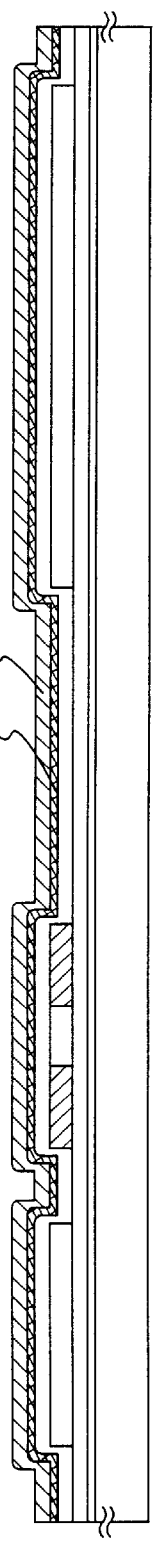
Fig. 8C (Formation of conductive layer for gate electrode and wiring)

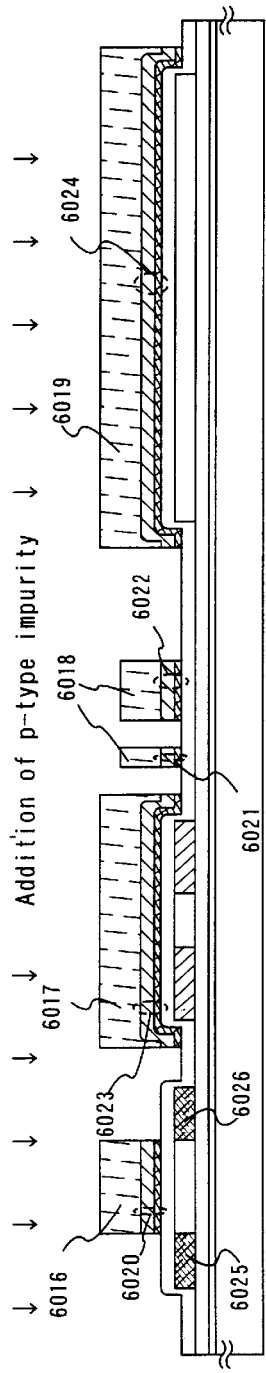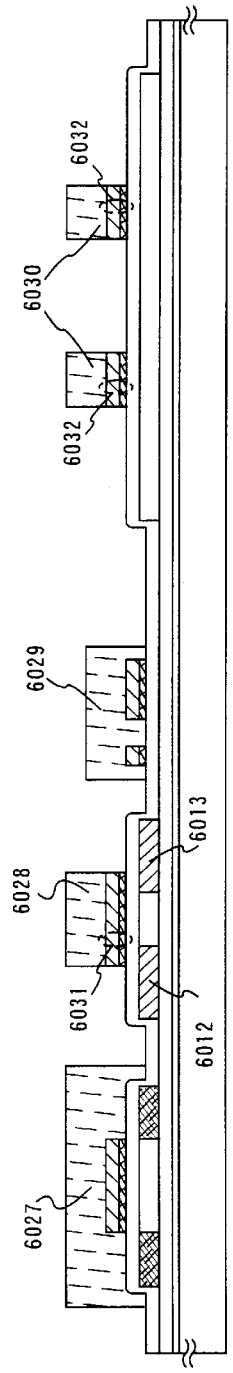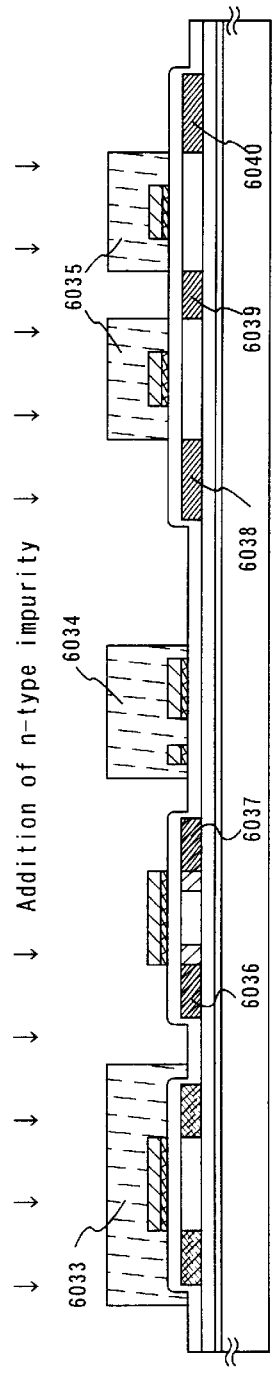
Fig. 9A (Formation of p-ch gate electrode, wiring electrode, p++ region)
Fig. 9B (Formation of n-ch gate electrode)
Fig. 9C (Formation of n+ region)

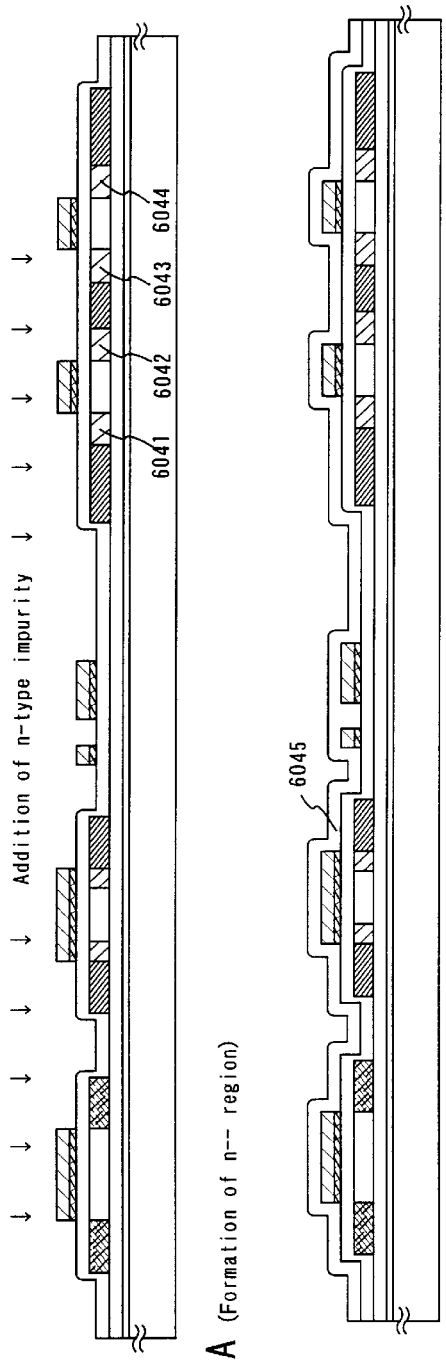
Fig. 10A (Formation of n-- region)
Fig. 10B (Thermal Activation)
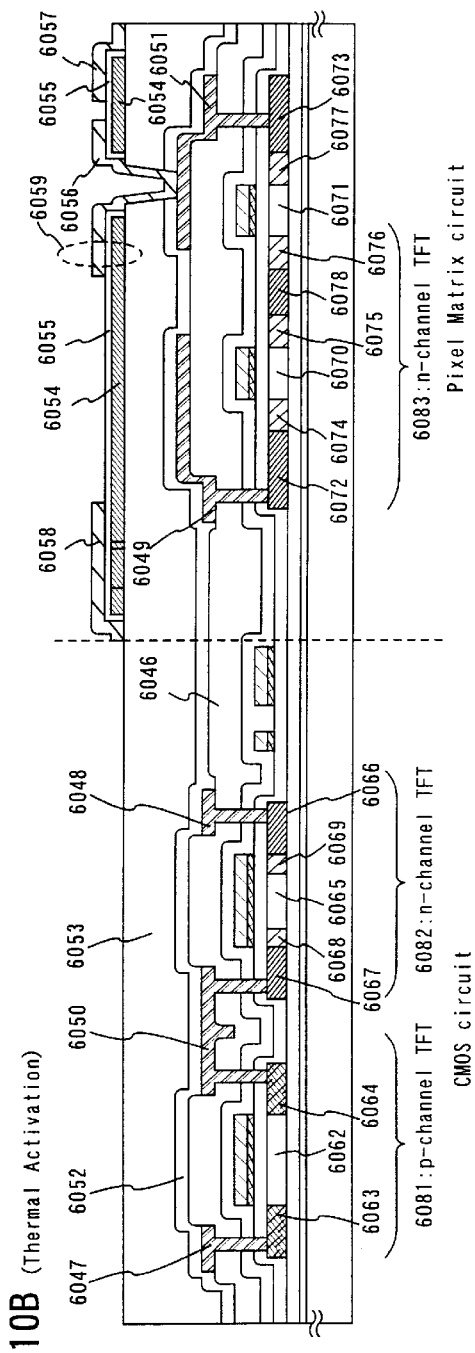
Fig. 10C (Formation of interlayer insulator, source/drain electrode, shielding film, pixel electrode, storage capacitor)

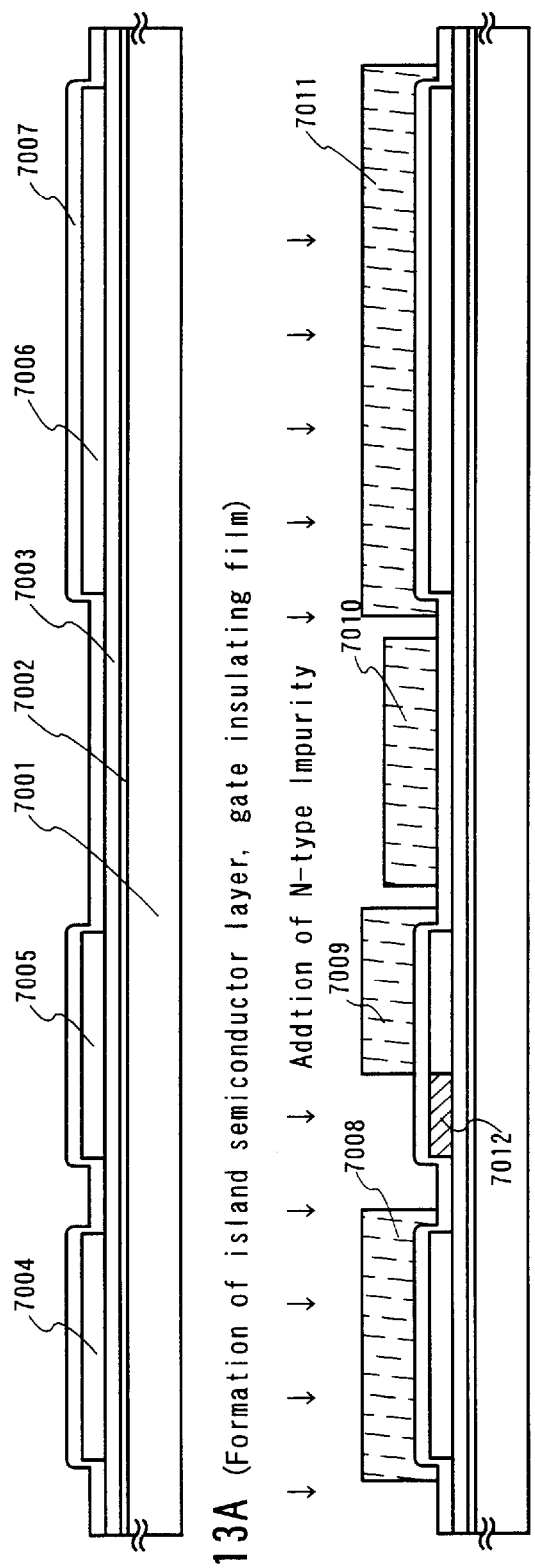
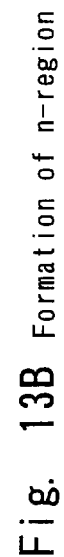
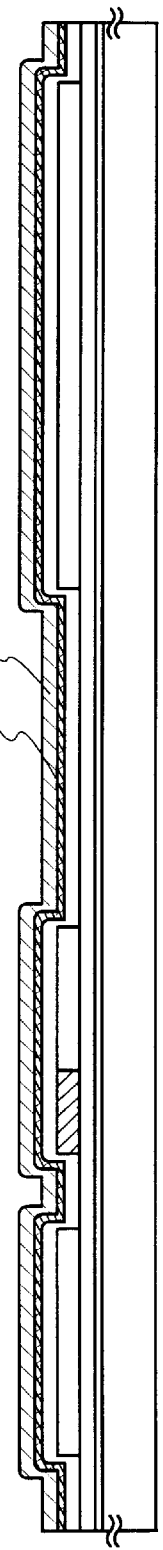
Fig. 13A (Formation of island semiconductor layer, gate insulating film)
Fig. 13B Formation of n-region
Fig. 13C (Formation of conductive layer for gate electrode and wiring)

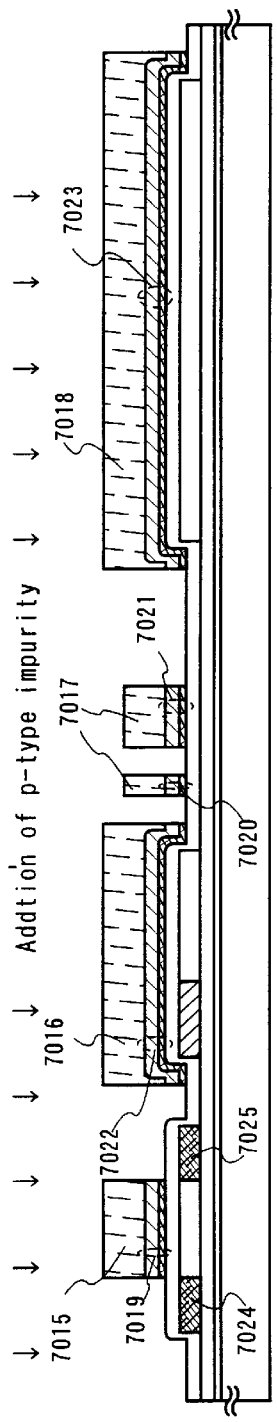
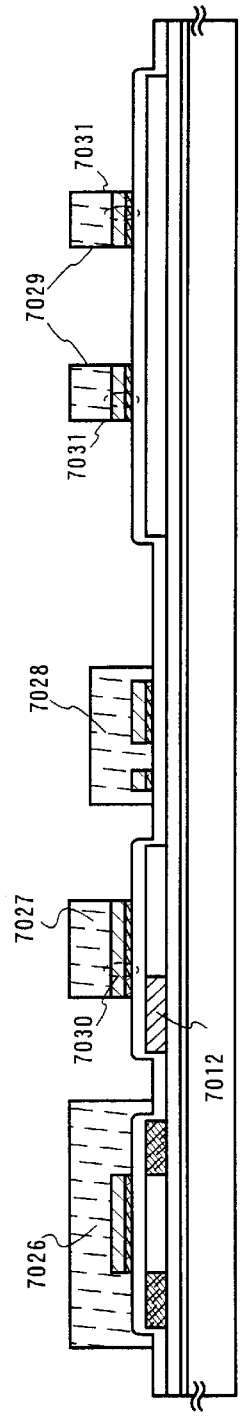
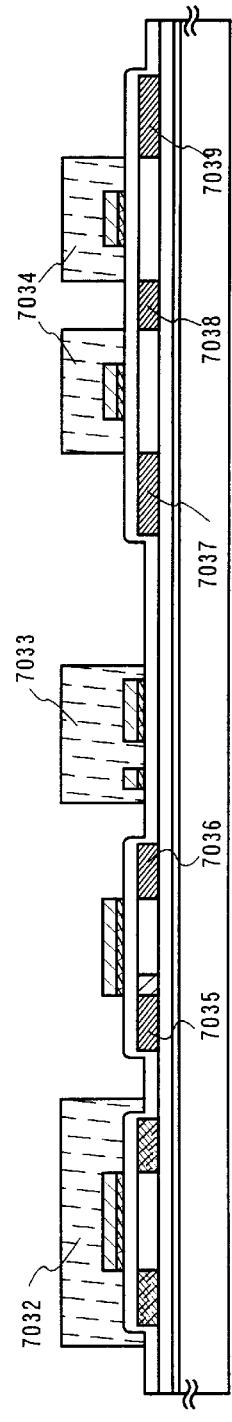
Fig. 14A (Formation of p-ch gate electrode, wiring electrode, p++ region)
Fig. 14B (Formation of n-ch gate electrode)
Fig. 14C (Formation of n+ region)

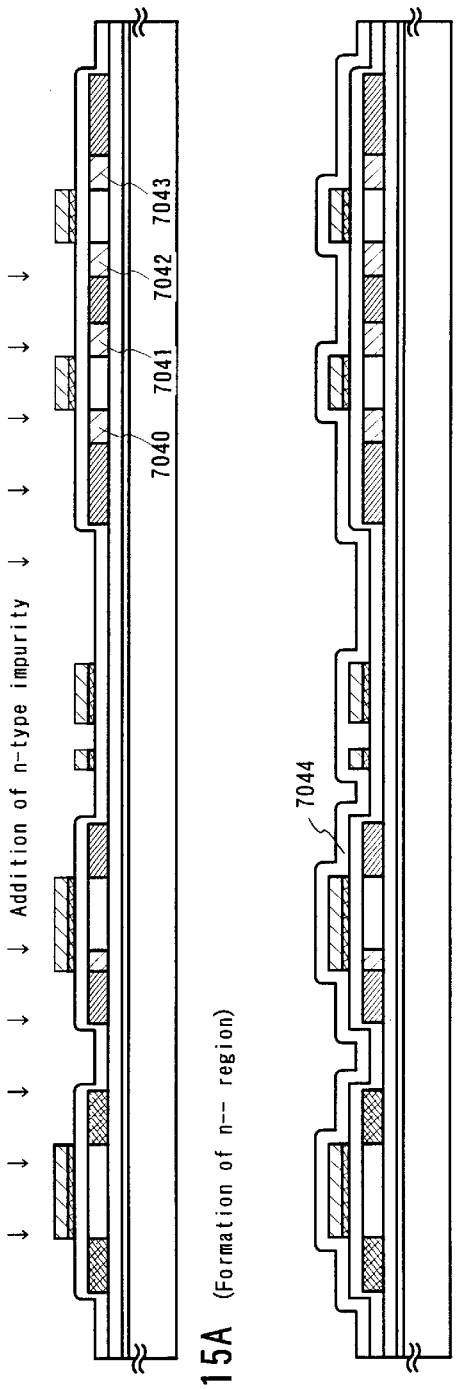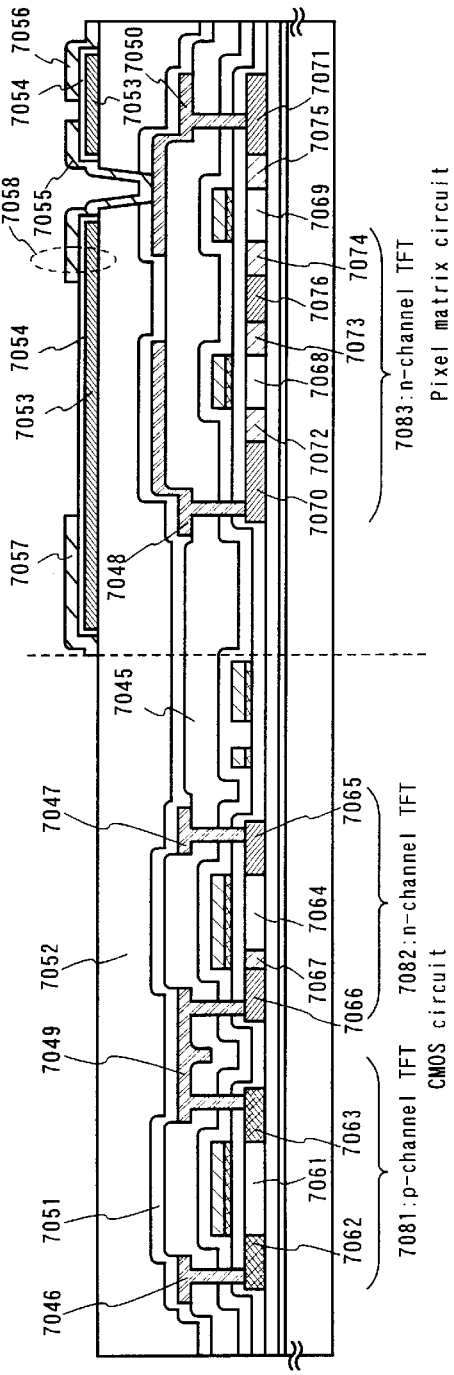

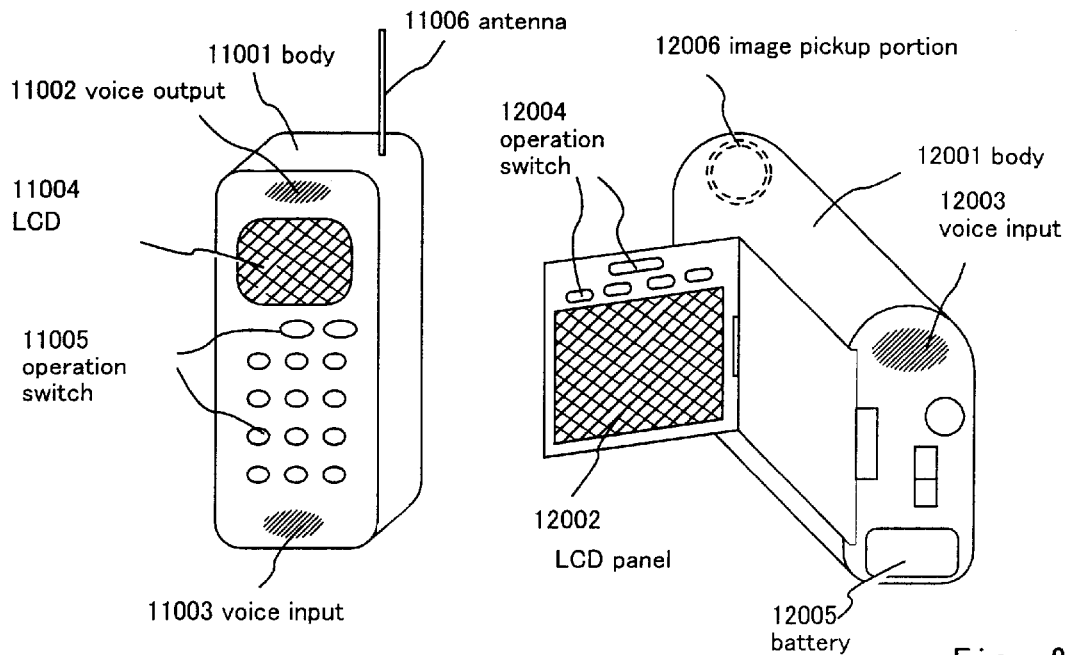
Fig. 21A
Fig. 21B
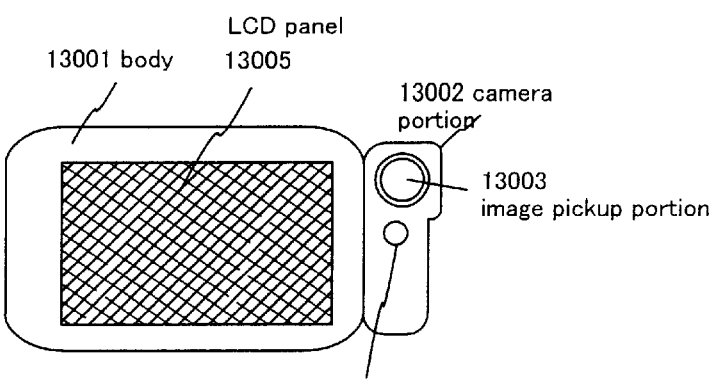
Fig. 21C
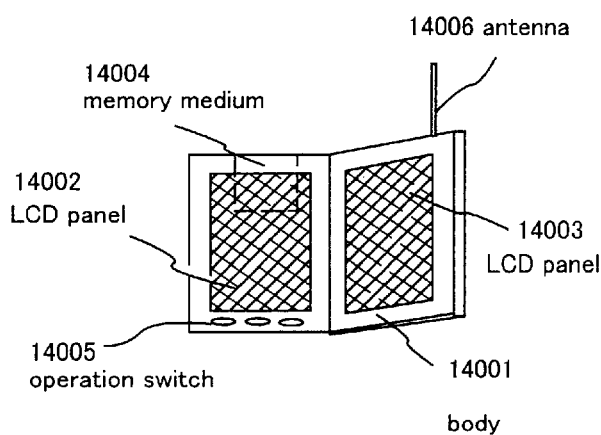
Fig. 21D

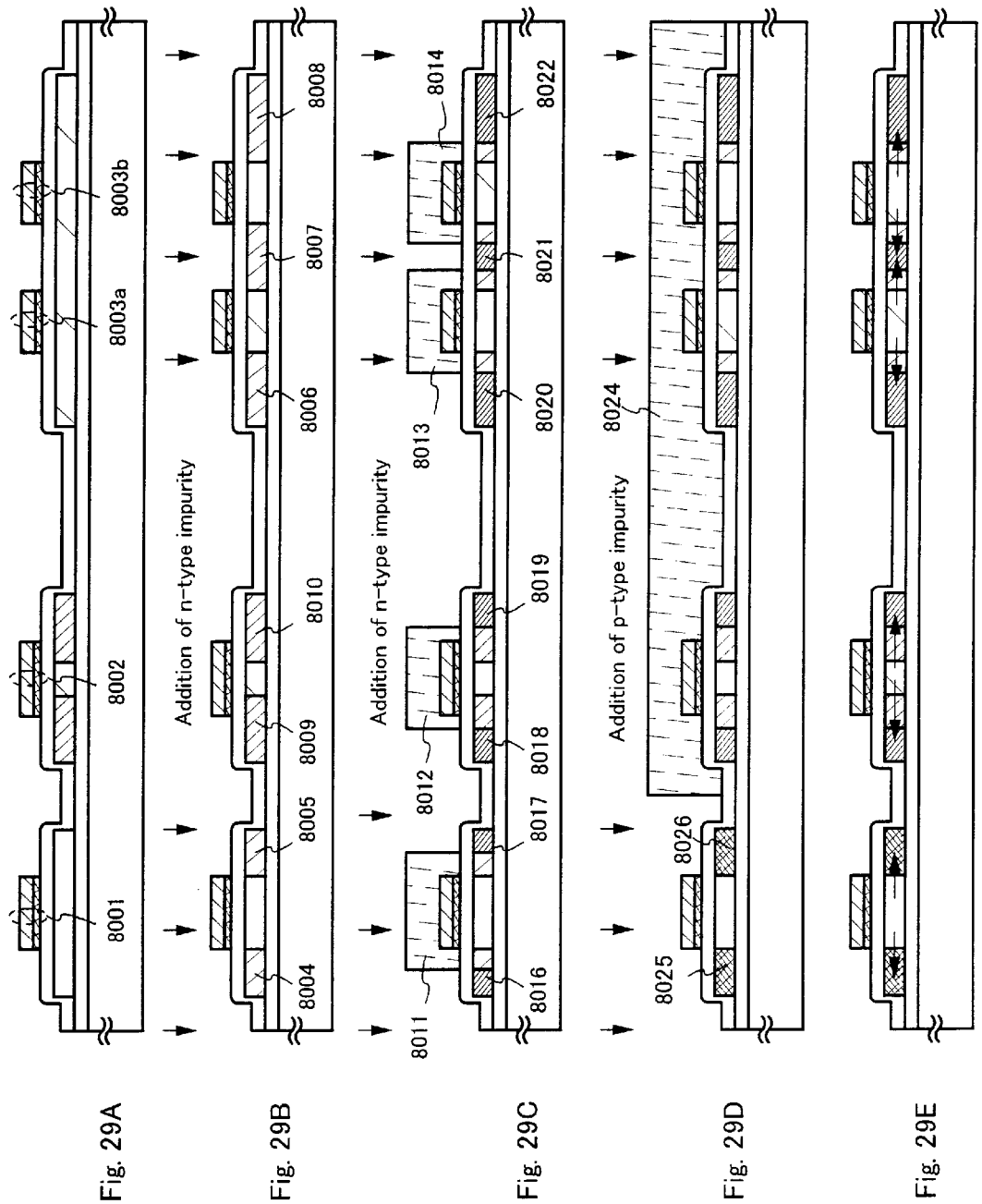

ACTIVE MATRIX TYPE DISPLAY DEVICE

BACKGROUND OF THE INVENTION

1. Field of the Invention

The present invention relates to an electrooptic device typified by a liquid crystal display in which a pixel matrix circuit and driving circuits disposed around thereof are provided on one substrate and to an electronic apparatus carrying such electrooptic device. It is noted that a semiconductor device refers to devices in general which function by utilizing the semiconductive characteristics including the electrooptic device and the electronic apparatus carrying the electrooptic device in the present specification.

2. Description of the Related Art

The technology for fabricating thin film transistors (TFT) on a low cost glass substrate has come to be rapidly developed in these days because the demand on an active matrix type liquid crystal display has been increasing. The active matrix type liquid crystal display is what a thin film transistor is disposed in each of several tens to several millions of pixels disposed in a matrix to control electric charge which goes in and out of each pixel electrode by the switching function of the thin film transistor.

Liquid crystal is sandwiched between each pixel electrode and an opposed electrode, thus forming a sort of capacitor. Accordingly, light transmitting through a liquid crystal panel may be controlled and an image may be displayed by changing the electrooptic characteristics of the liquid crystal by controlling the charge going in and out of the capacitor by the thin film transistor. However, the capacitor constructed as described above has had a problem that the electrooptic characteristics of the liquid crystal change and the contrast in displaying an image deteriorates because its holding voltage drops due to a leak of current.

Then, generally another capacitor called a holding capacitor also called storage capacitor) is disposed in series with the capacitor composed of the liquid crystal to supply electric charge lost due to the leak and others to the capacitor composed of the liquid crystal.

While the holding capacitor is constructed variously, typically it is constructed by sandwiching an oxide film as dielectric between a shielding film and the pixel electrode. The shielding film is a coating film having a light shielding characteristic for preventing the conductivity of the thin film transistor from fluctuating due to illumination of light in the pixel matrix section of the transmission type liquid crystal display. The shielding film may also function as a black matrix.

The holding capacitor having the structure in which the dielectric is sandwiched between the shielding film and the pixel electrode is connected to a common line to which reference potential is applied to keep the potential of the shielding film constant.

Then, in order to connect the shielding film with the common line after forming the shielding film by patterning in the process, a contact hole had to be created through an interlayer insulating film provided between the shielding film and the common line. The contact hole is created by means of photolithography using a mask.

The photolithography using the mask is carried out in the fabrication process of the active matrix type liquid crystal display in the processes of forming an active layer, of forming a gate insulating film, of forming the pixel electrode and of forming gate and source signal lines, besides the process of creating the contact hole through the interlayer insulating film provided between the shielding film and the common line. The photolithography using the mask has been the factor of increasing the number of fabrication steps of the active matrix type liquid crystal display and it has been desired to reduce the number of fabrication steps in order to achieve a high yield.

SUMMARY OF THE INVENTION

A driving method of applying inverse polar voltage to a source signal line connected to a pixel TFT is called as source line inversion in the active matrix type liquid crystal display. This source line inversion is carried out to prevent liquid crystal from deteriorating by always applying an electric field of one orientation to the liquid crystal. That is, it is possible to prevent the liquid crystal from deteriorating by always applying the electric field of one orientation by applying the signal whose polarity is inverted per line of the source signal lines and by inverting the polarity of the signals per one frame period as shown in FIG. 4. One frame period is a period during which all pixels display one screen.

The fluctuation of the potential of the shielding film may be averaged by using this source line inversion. Therefore, because the potential of the shielding film is kept almost constant when averaged temporally even when the shielding film is not connected to the common line whose potential is kept constant (reference potential), it is possible to float the shielding film in the holding capacitor having the structure in which the dielectric is sandwiched between the shielding film and the pixel electrode. Accordingly, it becomes unnecessary to create the contact hole through the interlayer insulating film provided between the shielding film and the common line by means of photolithography using the mask to connect the shielding film and the common line after forming the shielding film by patterning. Therefore, it becomes possible to reduce the number of processes for fabricating the active matrix type liquid crystal display, to achieve a high yield and to suppress the fabrication cost thereof.

In addition to the arrangement described above, the fluctuation $\Delta V$ of the potential of the shielding film is reduced by forming a large capacity coupling capacitor between the shielding film and the common line. The value of the $\Delta V$ is determined by capacitive value C of the coupling capacitor formed between the shielding film and the common line and electric charge Q applied to the shielding film. However, because the electric charge Q is fixed by a number of pixels and the value of voltage of a signal inputted to the source signal line, the value of fluctuation $\Delta V$ of the potential of the shielding film is actually decided by the capacitive value C of the coupling capacitor. The greater the value C, the smaller the $\Delta V$ is, thus allowing the potential of the shielding film to be kept more constant.

When a large capacity coupling capacitor is formed between the shielding film and the common line by floating the shielding film, it becomes unnecessary to create any contact hole through the interlayer insulating film provided between the shielding film and the common line by means of photolithography using a mask in the same manner with the arrangement of floating only the shielding film described above. It is preferable that the capacitive value of the coupling capacitor is ten times or more of the total of the capacitive values of all holding capacitors connected to one line of the gate signal line via the pixel TFTs. Accordingly, it becomes possible to reduce the number of processes for fabricating the active matrix type liquid crystal display, to achieve the high yield and to suppress the fabrication cost thereof. In addition to that, a good contrast maybe obtained when the large capacity coupling capacitor is created between the shielding film and the common line by floating the shielding film because the potential of the shielding film may be kept more constant.

The structure of the present invention will be described below.

According to one embodiment of the invention, there is provided an active matrix type liquid crystal display having a substrate provided with a plurality of pixel TFTs, pixel electrodes electrically connected to the pixel TFTs and a shielding film; and being characterized in that the shielding film is floating and a dielectric is provided between the pixel electrode and the shielding film. It allows the above-mentioned objects to be achieved.

According to another embodiment of the invention, there is provided an active matrix type liquid crystal display having a substrate provided with a plurality of source signal lines, a plurality of gate signal lines, a plurality of pixel TFTs, pixel electrodes electrically connected to the pixel TFTs and a shielding film, and being characterized in that the plurality of pixel TFTs are electrically connected to the source signal lines and gate signal lines:

the shielding film is floating:
  a dielectric is provided between the pixel electrode and the shielding film: and
  signals whose polarity is inverted per each of the plurality of source signal lines are applied to the source signal lines and the polarity of the signal applied to the respective one of the plurality of source signal lines is inverted per one frame period.

According to another embodiment of the invention, there is provided an active matrix type liquid crystal display having a first substrate provided with a plurality of source signal lines, a plurality of gate signal lines, a plurality of pixel TFTs, pixel electrodes and a shielding film;
  a second substrate provided with an opposed electrode; and
  liquid crystal sandwiched by the pixel electrode and the opposed electrode;
  and being characterized in that each of the pixel TFT has a gate electrode, a gate insulating film and an active layer having a source region, a drain region and a channel forming region;
  the gate electrode is connected with the gate signal line;
  the source region or drain region is connected to the source signal line;
  the drain or source region is connected to the pixel TFT;
  a dielectric is provided between the pixel electrode and the shielding film;
  the shielding film is floating; and
  signals whose polarity is inverted per each of the plurality of source signal lines are applied to the source signal lines and the polarity of the signal applied to the respective one of the plurality of source signal lines is inverted per one frame period.

According to one embodiment of the invention, there is provided an active matrix type liquid crystal display having a first substrate provided with a plurality of source signal lines, a plurality of gate signal lines, a plurality of pixel TFTs, pixel electrodes and a shielding film;
  a second substrate provided with an opposed electrode; and
  liquid crystal sandwiched by the pixel electrode and the opposed electrode;
  and being characterized in that each of the pixel TFT has a gate electrode, a gate insulating film and an active layer;
  the active layer has a channel forming region, at least one second impurity region in contact with the channel forming region and first impurity regions in contact with the second impurity region;
  the gate electrode is connected to the gate signal line;
  one of the first impurity regions is connected to the pixel electrode;
  the other one of the first impurity regions is connected to the source signal line;
  a dielectric is provided between the pixel electrode and the shielding film;
  the shielding film is floating;
  the second impurity region overlaps with the gate electrode via the gate insulating film; and
  signals whose polarity is inverted per each of the plurality of source signal lines are applied to the source signal lines and the polarity of the signal applied to the respective one of the plurality of source signal lines is inverted per one frame period.

According to another embodiment of the invention, there is provided an active matrix type liquid crystal display having a first substrate provided with a plurality of source signal lines, a plurality of gate signal lines, a plurality of pixel TFTs, pixel electrodes and a shielding film;
  second substrate provided with an opposed electrode; and
  liquid crystal sandwiched by the pixel electrode and the opposed electrode;
  and being characterized in that each of the pixel TFT has a gate electrode, a gate insulating film and an active layer;
  the active layer has a channel forming region, at least one second impurity region in contact with the channel forming region and first impurity regions provided while interposing the channel forming region;
  the gate electrode is connected to the gate signal line;
  one of the first impurity regions is connected to the pixel electrode;
  the other one of the first impurity regions is connected to the source signal line;
  a dielectric is provided between the pixel electrode and the shielding film;
  the shielding film is floating;
  the second impurity region overlaps with the gate electrode via the gate insulating film; and
  signals whose polarity is inverted per each of the plurality of source signal lines are applied to the source signal lines and the polarity of the signal applied to the respective one of the plurality of source signal lines is inverted per one frame period.

The dielectric may be an anode oxide film formed by anodizing the shielding film.

The shielding film may be a film containing aluminum (Al), titanium (Ti) or Tantalum (Ta).

The thickness of the shielding film may be 100 to 300 nm.

The gate electrode may contain one or a plurality of kinds of element selected from titanium (Ti), tantalum (Ta), tungsten (W) and molybdenum (Mo).

A rear type or front type projector in accordance with the present invention utilizes three panels of the above described active matrix type liquid crystal display devices. Also, a single-plate type rear projector utilizes the above described active matrix type liquid crystal display device. Further, a goggle type display of the present invention utilizes one active matrix type liquid crystal display described above.

According to one embodiment of the invention, there is provided an active matrix type liquid crystal display having a substrate provided with a pixel matrix section having a plurality of pixel TFTs and pixel electrodes electrically connected to the plurality of pixel TFTs, a shielding film and a common line whose potential is kept at constant reference potential; and being characterized in that:

the shielding film is floating;
a first dielectric is provided between the pixel electrode and the shielding film;
a second dielectric is provided between the shielding film and the common line; and
the second dielectric does not overlap with the pixel matrix section.

According to one embodiment of the invention, there is provided an active matrix type liquid crystal display having a substrate provided with a pixel matrix section having a plurality of pixel TFTs and pixel electrodes electrically connected to the plurality of pixel TFTs, a plurality of source signal lines, a plurality of gate signal lines, a shielding film and a common line whose potential is kept at constant reference potential; and being characterized in that.

the plurality of pixel TFTs are electrically connected to the source signal line and gate signal line;
the shielding film is floating;
a first dielectric is provided between the pixel electrode and the shielding film;
a second dielectric is provided between the shielding film and the common line;
the second dielectric does not overlap with the pixel matrix section; and
signals whose polarity is inverted per each of the plurality of source signal lines are applied to the source signal lines and the polarity of the signal applied to the respective one of the plurality of source signal lines is inverted per one frame period.

According to one embodiment of the invention, there is provided an active matrix type liquid crystal display, having:

a first substrate provided with a pixel matrix section having a plurality of pixel TFTs and pixel electrodes electrically connected to the plurality of pixel TFTs, a plurality of source signal lines, a plurality of gate signal lines, a shielding film and a common line whose potential is kept at constant reference potential;
a second substrate provided with an opposed electrode; and
liquid crystal sandwiched by the pixel electrode and the opposed electrode;
and being characterized in that each of the pixel TFT has a gate electrode, a gate insulating film, a source region, a drain region and an active layer having a channel forming region,
the gate electrode is connected to the gate signal line;
the source region or drain region is connected to the source signal line;
the drain region or source region is connected to the pixel electrode;
the shielding film is floating;
a first dielectric is provided between the pixel electrode and the shielding film;
a second dielectric is provided between the shielding film and the common line;
the second dielectric does not overlap with the pixel matrix section; and
signals whose polarity is inverted per each of the plurality of source signal lines are applied to the source signal lines and the polarity of the signal applied to the respective one of the plurality of source signal lines is inverted per one frame period.

According to one embodiment of the invention, there is provided an active matrix type liquid crystal display, having:

a first substrate provided with a pixel matrix section having a plurality of pixel TFTs and pixel electrodes electrically connected to the plurality of pixel TFTs, a plurality of source signal lines, a plurality of gate signal lines, a shielding film and a common line whose potential is kept at constant reference potential;
a second substrate provided with an opposed electrode; and
liquid crystal sandwiched by the pixel electrode and the opposed electrode;
and being characterized in that each of the pixel TFT has a gate electrode, a gate insulating film and an active layer;
the active layer has a channel forming region, at least one second impurity region in contact with the channel forming region and first impurity regions in contact with the second impurity region;
the gate electrode is connected to the gate signal line;
one of the first impurity regions is connected to the pixel electrode;
the other one of the first impurity regions is connected to the source signal line;
the shielding film is floating;
a first dielectric is provided between the pixel electrode and the shielding film;
a second dielectric is provided between the shielding film and the common line;
the second dielectric does not overlap with the pixel matrix section;
the second impurity region overlaps with the gate electrode via the gate insulating film; and
signals whose polarity is inverted per each of the plurality of source signal lines are applied to the source signal lines and the polarity of the signal applied to the respective one of the plurality of source signal lines is inverted per one frame period.

According to one embodiment of the invention, there is provided an active matrix type liquid crystal display, having:

a first substrate provided with a pixel matrix section having a plurality of pixel TFTs and pixel electrodes electrically connected to the plurality of pixel TFTs, a plurality of source signal lines, a plurality of gate signal lines, a shielding film and a common line whose potential is kept at constant reference potential;
a second substrate provided with an opposed electrode; and
liquid crystal sandwiched by the pixel electrode and the opposed electrode;
the active matrix type liquid crystal display being characterized in that each of the pixel TFT has a gate electrode, a gate insulating film and an active layer;
the active layer has a channel forming region, at least one second impurity region in contact with the channel forming region and first impurity regions provided while interposing the channel forming region;

the gate electrode is connected to the gate signal line;
one of the first impurity regions is connected to the pixel electrode;
the other one of the first is connected to the source signal line;
the shielding film is floating;
a first dielectric is provided between the pixel electrode and the shielding film;
a second dielectric is provided between the shielding film and the common line;
the second dielectric does not overlap with the pixel matrix section;
the second impurity region overlaps with the gate electrode via the gate insulating film; and
signals whose polarity is inverted per each of the plurality of source signal lines are applied to the source signal lines and the polarity of the signal applied to the respective one of the plurality of source signal lines is inverted per one frame period.

According to one embodiment of the invention, there is provided an active matrix type liquid crystal display, having:
a first substrate provided with a pixel matrix section having a plurality of pixel TFTs and pixel electrodes electrically connected to the plurality of pixel TFTs, a shielding film and a common line whose potential is kept at constant reference potential; and
a second substrate provided with an opposed shielding film;
and being characterized in that each of the pixel TFT has a gate electrode, a gate insulating film and an active layer;
the shielding film is floating;
first dielectric is provided between the pixel electrode and the shielding film;
second dielectric is provided between the shielding film and the common line;
the second dielectric does not overlap with the pixel matrix section;
the source signal line driving circuit has a sampling circuit; and
the opposed shielding film overlaps with a part of the shielding film and the sampling circuit.

The first dielectric may be an anode oxide film formed by anodizing the shielding film and the second dielectric may be an anode oxide film formed by anodizing the shielding film.

The shielding film may comprise a metal selected from aluminum (Al), titanium (Ti), and tantalum (Ta).

The thickness of the shielding film may be 100 to 300 nm.

The gate electrode may contain one or a plurality of kinds of element selected from titanium (Ti), tantalum (Ta), tungsten (W) and molybdenum (Mo).

It is then possible to provide a rear projector provided with three active matrix devices described above, a front projector provided with three active matrix devices described above, a single-plate type rear projector provided with one active matrix type liquid crystal display described above and a goggle type display provided with two active matrix devices described above.

Also, it is preferable that the shielding film be not formed over a source line driver circuit in order to avoid an influence of an undesirable capacitance.

BRIEF DESCRIPTION OF THE DRAWINGS

Figures 4A, 4B:
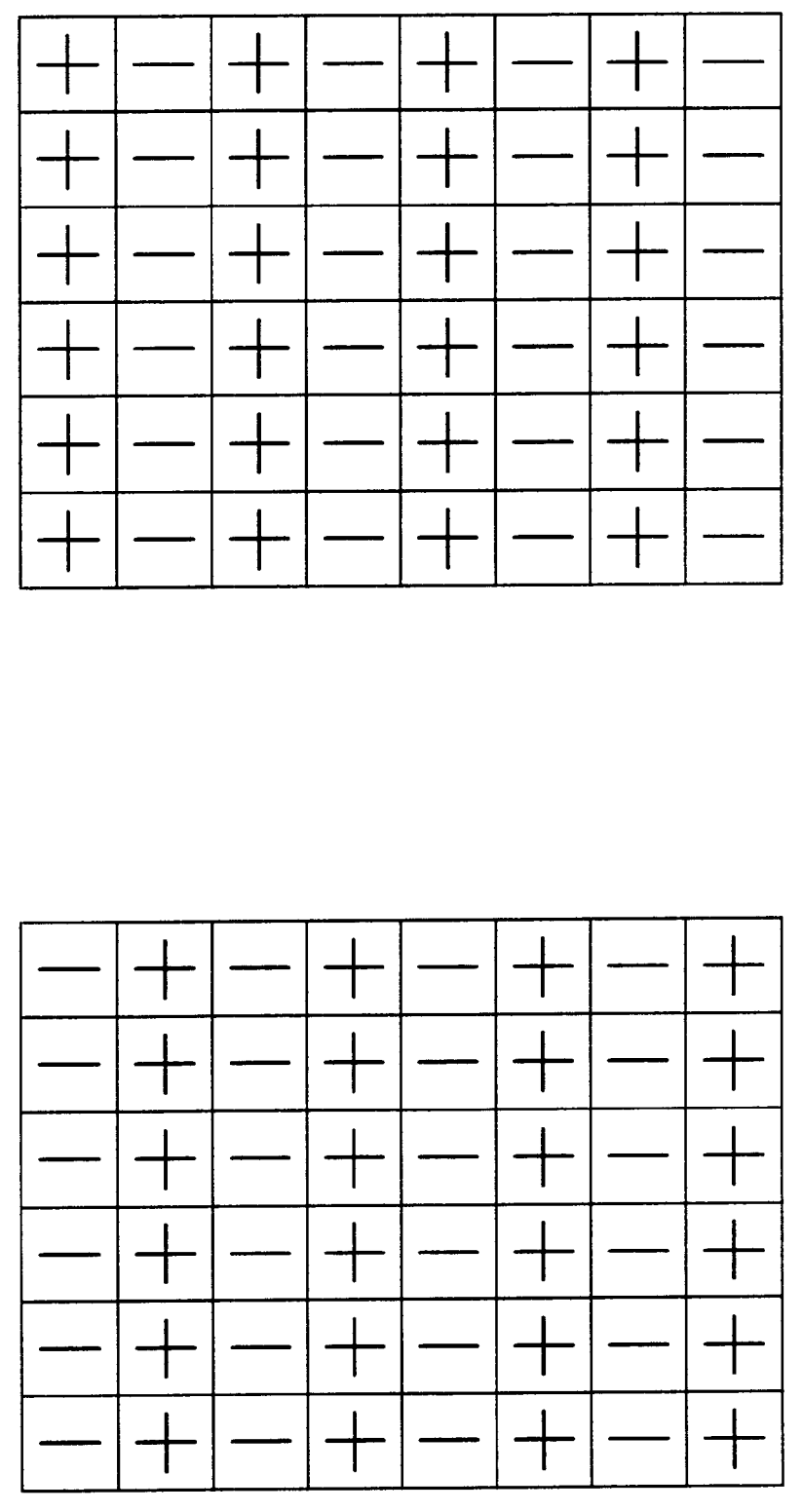

FIGS. 4A and 4B are diagrams showing the concept of source line inversion;

FIGS. 8A through 8C are section views showing a fabrication process of an inventive TFT;

FIGS. 9A through 9C are section views showing the fabrication process of the inventive TFT;

FIGS. 10A through 10C are section views showing the fabrication process of the inventive TFT;

FIGS. 13A through 13C are section views showing a fabrication process of an inventive TFT;

FIGS. 14A through 14C are section views showing the fabrication process of the inventive TFT;

FIGS. 15A through 15C are section views showing the fabrication process of the inventive TFT;

FIGS. 21A through 21D show examples of electronic apparatus using the inventive liquid crystal display;

FIGS. 29A through 29E are section views showing a process for fabricating the inventive TFT;

DESCRIPTION OF THE PREFERRED EMBODIMENTS

The present invention will be explained below by preferred embodiments thereof. It is noted that the present invention is not limited to those in the following embodiments. Although liquid crystal displays will be discussed in the following embodiments, the present invention may be applied to other types of active matrix displays. The embodiments will be explained with reference to FIGS. 1 through 31.

[First Embodiment]

One example of the active matrix liquid crystal display using the present invention will be explained by using FIG. 1.

Figure 1:
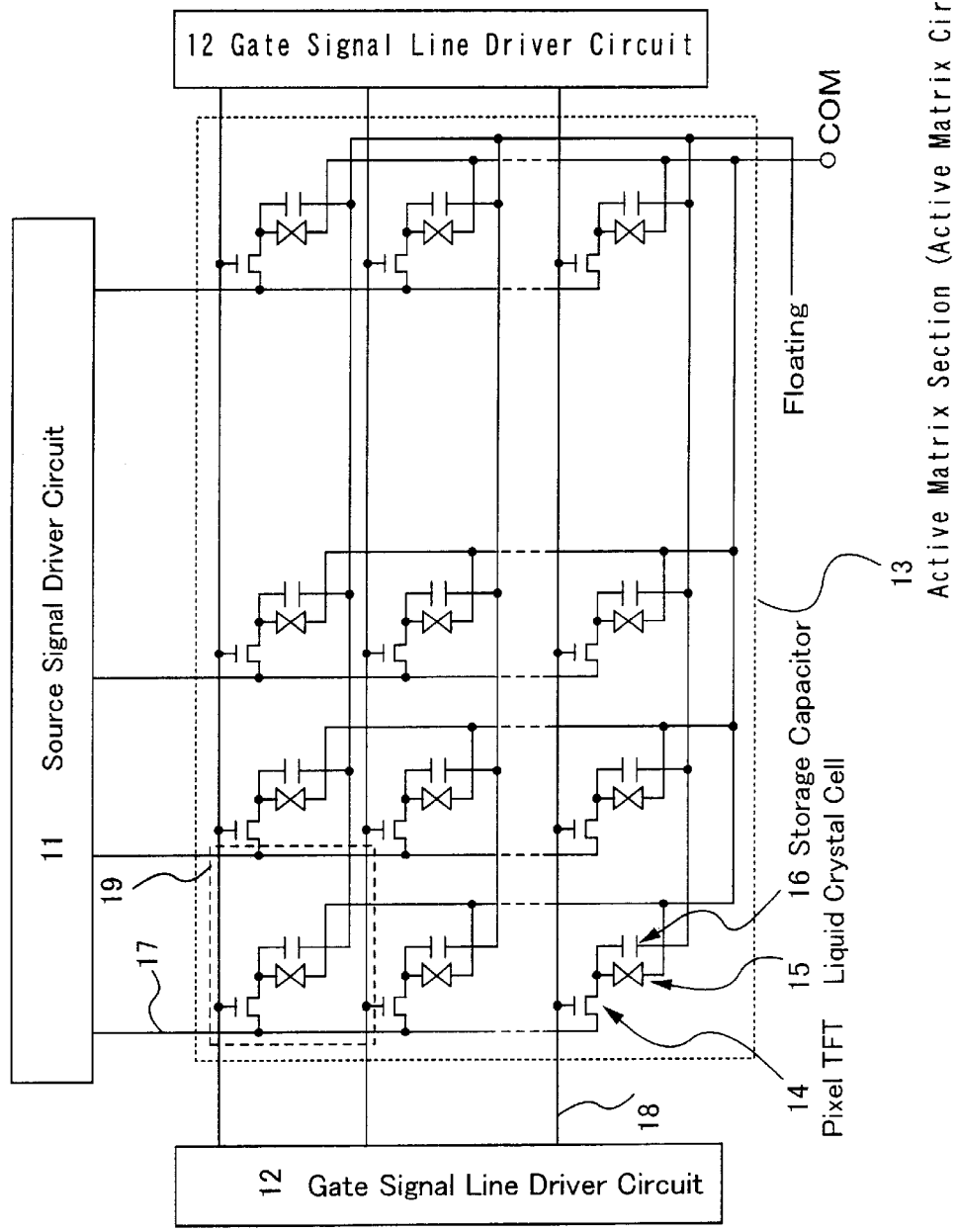
FIG. 1 is a circuit diagram of an active matrix circuit of the invention.

FIG. 1 shows one example of a circuit diagram of the inventive active matrix circuit using a holding capacitor. Provided as shown in FIG. 1 are a source signal line driving circuit 11, a gate signal line driving circuit 12, an active matrix circuit 13, a pixel TFT 14, liquid crystal cells 15 sandwiching liquid crystal between a pixel electrode and an opposed electrode, a holding capacitor 16 formed by sandwiching dielectric between the pixel electrode and a shielding film, a source signal line 17 and a gate signal line 18. The source signal line driving circuit 11 and the gate signal line driving circuit 12 are called as driving circuits in general. These driving circuits and a pixel matrix section comprising the active matrix circuit are formed on a same substrate.

In the active matrix section 13, the source signal line 17 connected to the source signal line driving circuit 11 crosses with the gate signal line 18 connected to the gate signal line driving circuit 12. The pixel thin film transistor (pixel TFT) 14, the liquid crystal cell 15 sandwiching the liquid crystal between the opposed electrode and the pixel electrode and the holding capacitor 16 are provided in the region surrounded by the source signal line 17 and the gate signal line 18, i.e., in a pixel section 19.

The holding capacitor 16 is constructed by sandwiching an oxide film as the dielectric between the pixel electrode and the shielding film and all the shielding films are put into a floating condition in which they are not connected to the common lines.

The pixel TFT 14 selects an image signal inputted to the source signal line 17 to write into a predetermined pixel electrode.

The image signal sampled by a timing signal outputted from the source signal line driving circuit 11 is supplied to the source signal line 17.

The pixel TFT 14 operates by a selection signal inputted from the gate signal line driving circuit 12 via the gate signal line 18.

The image signal inputted to the source signal line 17 is applied by inverting the polarity thereof per one line of the source signal line 17 and the polarity of the signals is inverted per each one frame period to prevent the liquid crystal from deteriorating by always applying the electric field of one orientation to the liquid crystal. Thus, the liquid crystal is driven by way of source line inversion and the shielding film is put into the floating state without connecting to the common line. The potential of the shielding film may be kept constant when averaged temporally by constructing as described above without connecting the shielding film to the common line, so that the holding capacitor having the structure in which the dielectric is sandwiched between the shielding film and the pixel electrode may be formed. Accordingly, it becomes unnecessary to create a contact hole by means of photolithography using a mask through an interlayer insulating film provided between the shielding film and the common line to connect the shielding film with the common line. Thereby, it becomes possible to reduce a number of fabrication steps, to achieve a high yield and to suppress the fabrication cost of the active matrix liquid crystal display.

Next, the detailed structure of the pixel section 19 shown in FIG. 1 will be explained with reference to FIG. 2.

Figure 2:
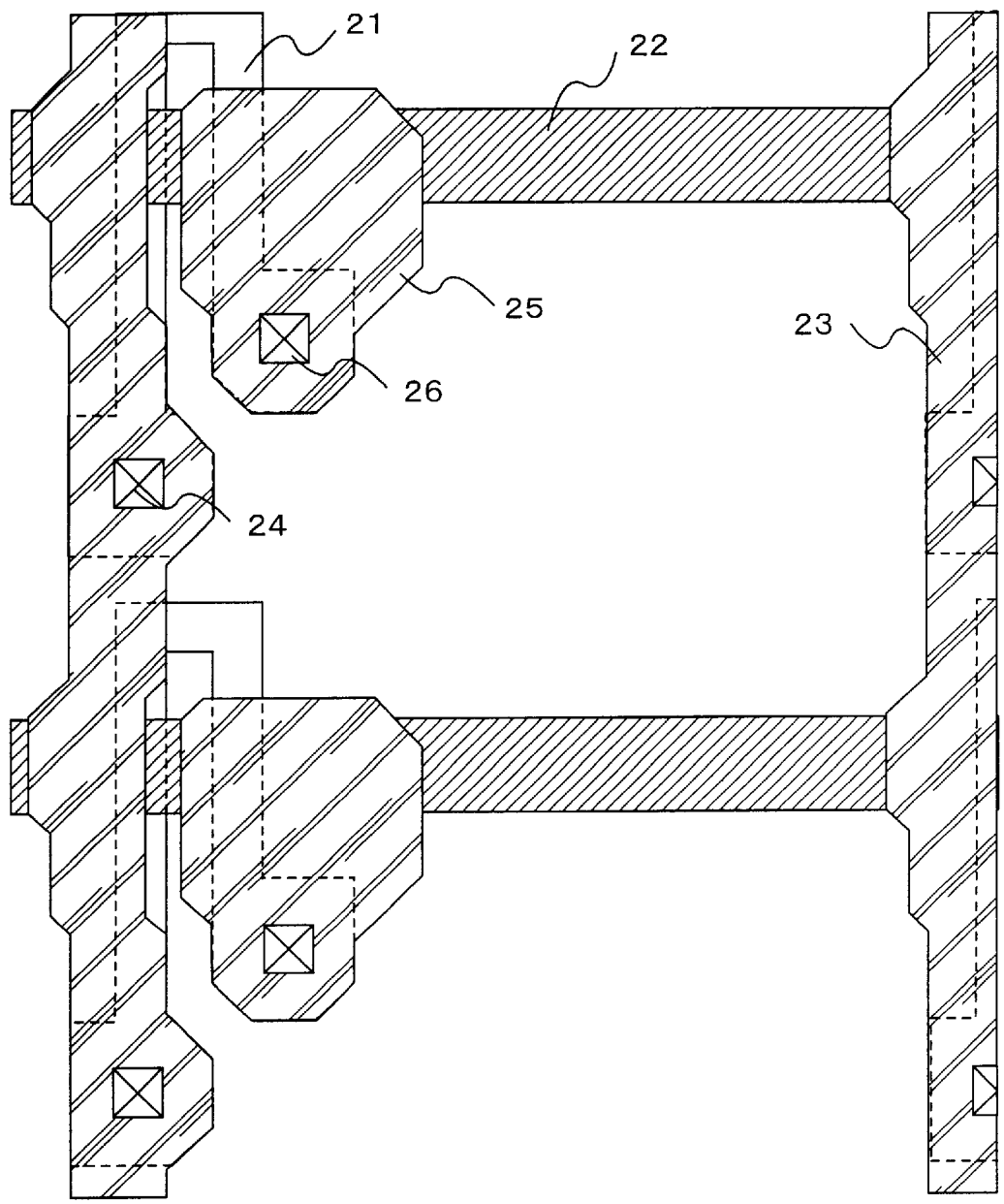
FIG. 2 is a diagram showing the upper structure of an inventive pixel matrix circuit.

The FIG. 2 shows an active layer 21, a gate signal line 22, a source signal line 23, a contact section 24 of the active layer and the source signal line, a drain wire (drain electrode) 25 and a contact section 26 of the active layer and the drain wire.

Figure 3:
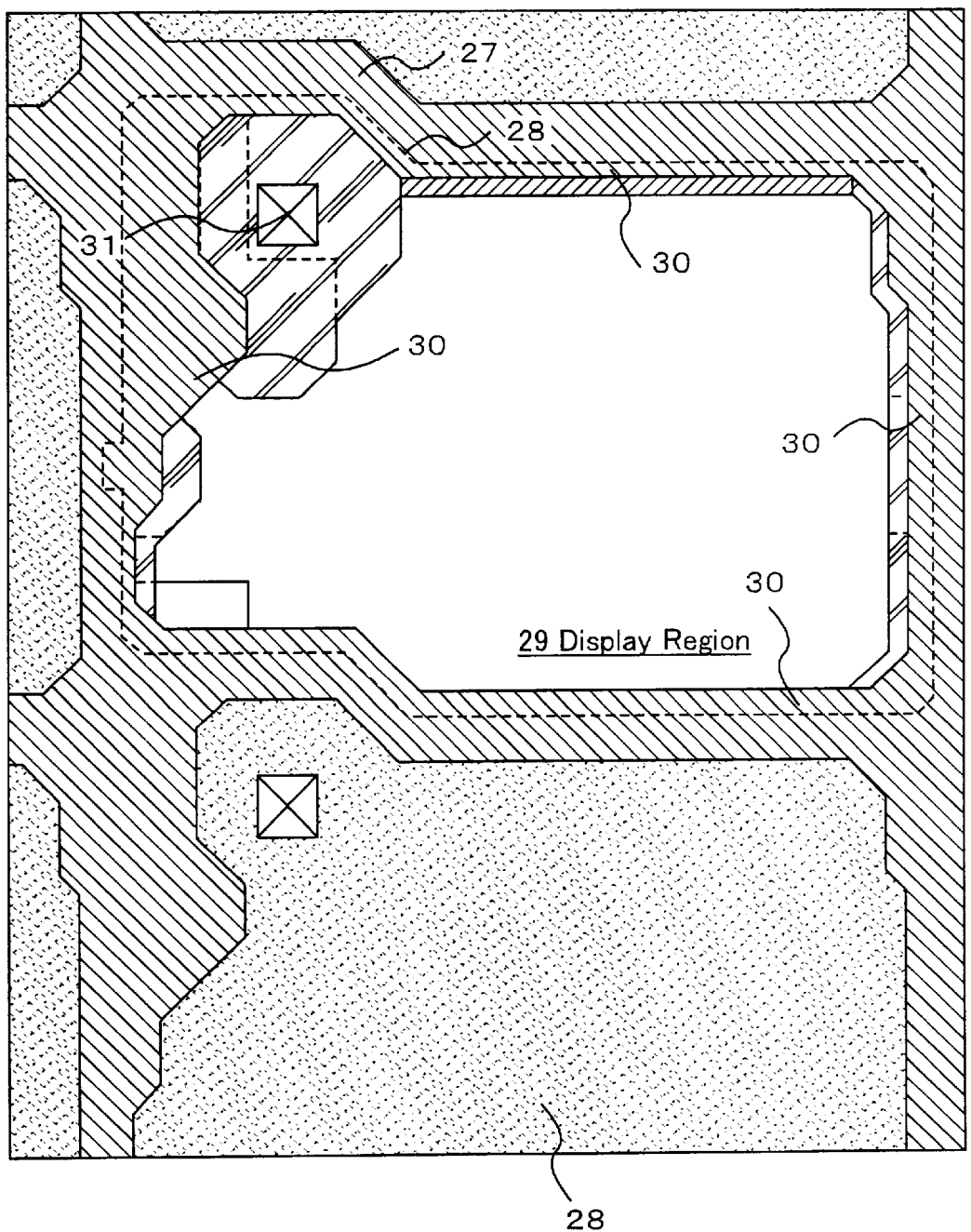
FIG. 3 is another diagram showing the upper structure of the inventive pixel matrix circuit.

FIG. 3 shows the state in which a shielding film 27 and a pixel electrode 28 are superimposed to those shown in FIG. 2. It is noted that although the pixel electrode 28 is partially indicated by a dot line, it specifies the positional relationship with the underlayer shielding film.

As shown in FIG. 3, the pixel electrode 28 is formed so that it overlaps with the shielding film 27 at the peripheral part of an image display region 29. The region 30 where the pixel electrode 28 overlaps with the shielding film 27 function as a holding capacitor 17. The reference numeral 31 shows a contact portion between the drain wiring 25 and the pixel electrode 28.

Although the shielding film 27 can not be provided at the contact section 31, no light hits the TFT because it is totally blocked by the drain wire 25.

Next, one example of the source signal line driving circuit shown in FIG. 1 will be explained.

Figure 5:
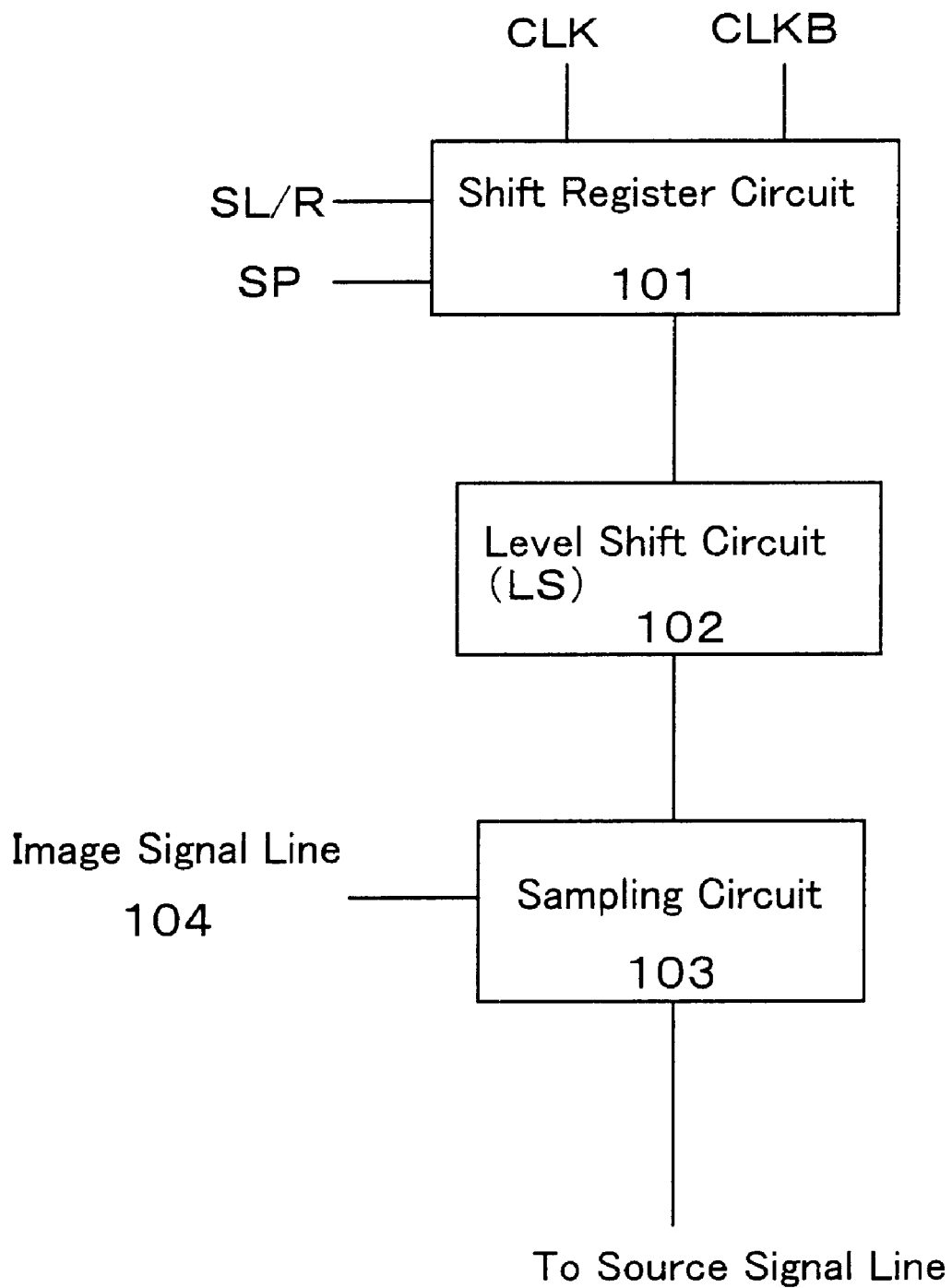
FIG. 5 is a block diagram of a source signal line driving circuit.

FIG. 5 is a block diagram of the source signal line driving circuit 11 shown in FIG. 1. CLK denotes a clock signal, CLKB an inverted clock signal, SP a start pulse signal and SL/R a driving direction switching signal, respectively.

Figure 6:
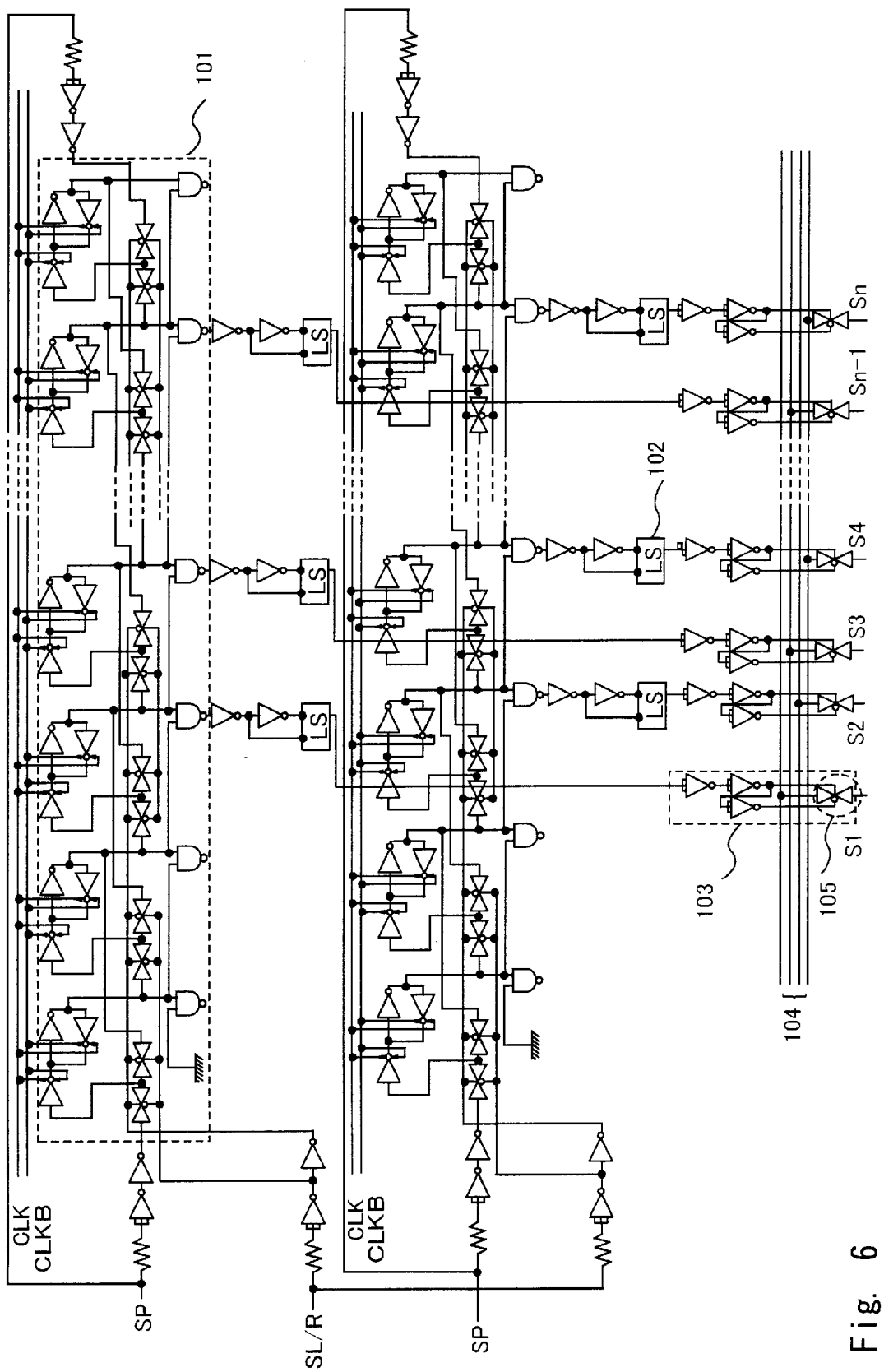
FIG. 6 is a circuit diagram of the source signal line driving circuit.

FIG. 6 shows one concrete structural example of the circuit shown in FIG. 5. A shift register circuit 101, a level shift circuit 102, a sampling circuit 103 and an image signal line 104 are disposed as shown in the figure.

The clock signal (CLK), the inverted clock signal (CLKb), the start pulse signal (SP) and the driving direction switching signal (SL/R) are inputted from the wire shown in FIG. 5 to the shift register circuit.

The clock signal (CLK) of 10 V for example inputted from the outside of the source signal line driving circuit is inputted to the shift register circuit 101. Then, the shift register circuit 101 operates by the inputted clock signal and the start pulse signal inputted to the shift register circuit 101 in the same time and generates timing signals for sampling images one after another.

The generated timing signal is inputted to a level shift circuit (LS) 102 to raise the voltage amplitude level. Here, the voltage amplitude level means an absolute value of the difference (potential difference) between the highest potential and the lowest potential of the signal. The increase (rise) of the voltage amplitude level means that the potential difference increases and the decrease of the voltage amplitude level means that the potential difference reduces. The timing signal whose voltage amplitude level has been increased is inputted to the sampling circuit 103 having an analog switch 105 and the sampling circuit 103 operates and samples image signals based on the inputted timing signal. The sampled image signal is inputted to the pixel matrix section via the source signal lines (S1 through Sn).

The sampled image signal is applied in the inverse polarity per image signal line. Thereby, the inverse polarity image signal is sampled per one source signal line to be applied to the liquid crystal. In other words, the liquid crystal is driven by way of the source line inversion. Therefore, the potential of the shielding film may be kept constant when averaged temporally without connecting to the common line whose potential is kept at fixed potential (reference potential), so that the shielding film may be put into the floating state in the holding capacitor having the structure in which the dielectric is sandwiched between the shielding film and the pixel electrode. Accordingly, it becomes unnecessary to create a contact hole by means of photolithography using a mask through the interlayer insulating film provided between the shielding film and the common line to connect the shielding film and the common line after forming the shielding film by means of patterning. Thus, it becomes possible to reduce the number of fabrication steps, to achieve the high yield and to suppress the fabrication cost of the active matrix liquid crystal display.

Figure 7A:
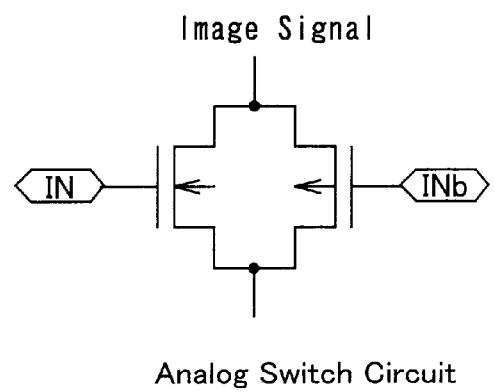
FIGS. 7A and 7B are equivalent circuit diagrams of an analog switch and a level shift circuit.
Figure 7B:
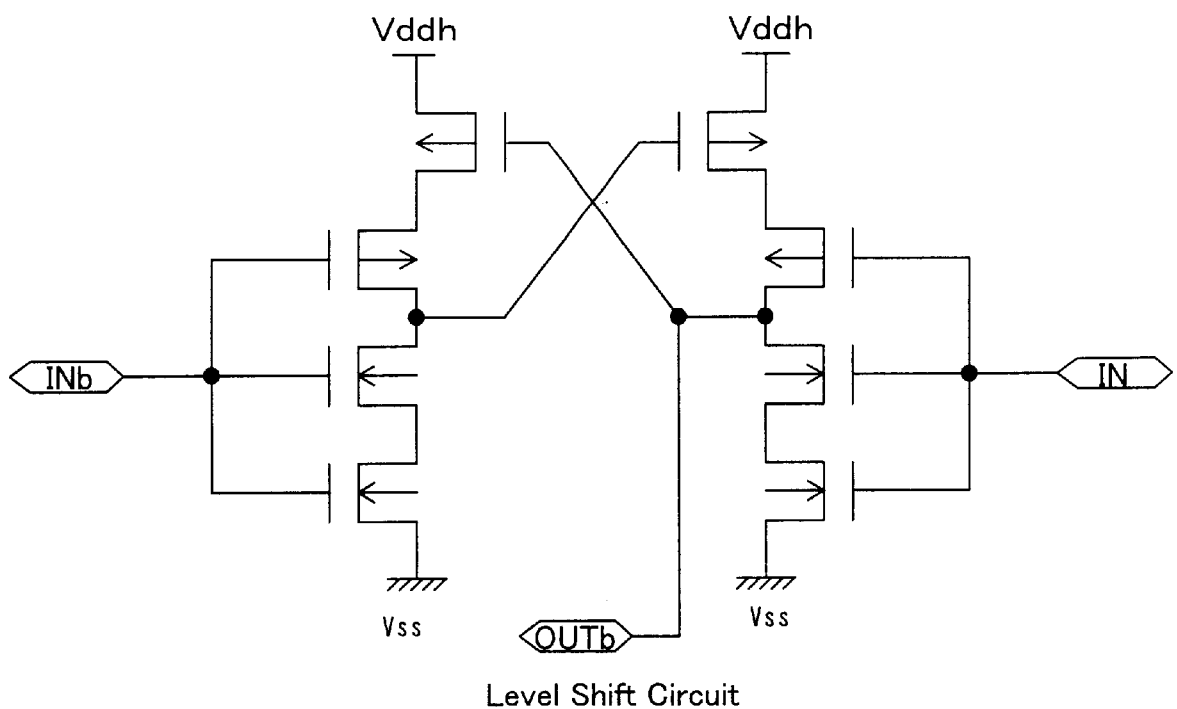

FIGS. 7A and 7B are concrete circuit diagrams of the analog switch 105 and the level shift circuit 102.

FIG. 7A is an equivalent circuit diagram of the analog switch. An image signal is sampled by inputted signals (IN and INb). FIG. 7B is an equivalent circuit diagram of the level shift circuit. IN means that a signal is inputted and INb means that an inverted signal of IN is inputted. Vddh means that plus voltage is applied and Vss means that minus voltage is applied. The level shift circuit is designed so that the signal inputted through IN whose voltage has been increased and which has been inverted is outputted from OUTb. That is, when Hi is inputted through IN, a signal equivalent to Vss is outputted from the OUTb and when Lo is inputted, a signal equivalent to Vddh is outputted from OUTb.

Next, one example of the method for fabricating the inventive pixel matrix circuit and the TFTs of the driver circuits provided around that in the same time will be explained with reference to FIGS. 8 through 10. It is noted that the present invention is not limited to this fabrication method.

[Process for Forming Island Semiconductor Layer and Gate Insulating Film: FIG. 8A]

In FIG. 8A, it is preferable to use a non-alkali glass substrate or a quartz substrate as a substrate 6001. Besides them, the substrate may be a silicon substrate or a metal substrate on which an insulating film is formed.

An underlayer film 6002 made of a silicon oxide film, a silicon nitride film or a silicon nitride oxide film was formed into a thickness of 100 to 400 nm on the surface of the substrate 6001 where the TFTs are to be formed, by means of plasma CVD or sputtering. The underlayer film 6002 may be formed into the double-layer structure of the silicon nitride film 6002 of 25 to 100 nm thick, or 50 nm here, and of the silicon oxide film 6003 of 50 to 300 nm, or 150 nm here. The underlayer film 6002 is provided to prevent contamination of impurity from the substrate and needs not be provided always when the quartz substrate is used.

Next, an amorphous silicon film of 20 to 100 nm thick was formed on the underlayer film 6002 by means of publicly known film forming method. Although it depends on the hydrogen content, it is desirable to carry out the crystallization process after reducing the hydrogen content below 5 atom % by heating several hours preferably in 400 to 550° C. to dehydrogenate it. Although the amorphous silicon film may be formed by another fabrication method such as sputtering or evaporation, it is desirable to fully reduce impurity elements such as oxygen and nitrogen contained in the film. Here, the underlayer film and the amorphous silicon film may be formed continuously because they may be formed by the same film forming method. It is possible to prevent the contamination of the surface and to reduce the dispersion of characteristics of the fabricated TFTs by not exposing the underlayer film to the atmosphere once after forming it.

The process for forming the crystalline silicon film from the amorphous silicon film may be carried out by using the publicly known laser crystallization or thermal crystallization method. The crystalline silicon film may be fabricated by means of thermal crystallization by using a catalyst element which promote the crystallization of silicon. Besides them, a micro-crystal silicon film may be formed or a crystalline silicon film may be directly formed. The crystalline silicon film may be also formed by using the publicly known technology of SOI (Silicon On Insulators) by which monocrystal silicon is pasted on the substrate.

The island semiconductor layers 6004 through 6006 were formed by etching unnecessary parts of the crystalline silicon film thus formed. Boron (B) may be added at concentration of $1\times10^{15}$ to $5\times10^{17}$ cm$^{-3}$ in advance in order to control threshold voltage in the region of the crystalline silicon film where the n-channel type TFT is fabricated.

Next, agate insulating film 6007 whose main component is silicon oxide or silicon nitride was formed so as to cover the island semiconductor layers 6004 through 6006. The gate insulating film 6007 may be formed into a thickness of 10 to 200 nm or more preferably from 50 to 150 nm. For instance, a silicon nitride oxide film whose raw materials are $N_2O$ and $SiH_4$ and whose thickness is 75 nm is formed by means of plasma CVD. Then, it is thermally oxidized at 800 to 1000° C. within oxygen atmosphere or mixed atmosphere of oxygen and hydrochloric acid to form the gate insulating film of 115 nm (FIG. 8A).

[Forming n⁻ Region: FIG. 8B]

Resist masks 6008 through 6011 were formed on the whole surface of the region where the island semiconductor layers 6004 and 6006 and the wires are to be formed and at part of the island semiconductor layer 6005 (including the region which turns out to be a channel forming region) and impurity element giving n-type was added to form low concentration impurity regions 6012 and 6013. The low concentration impurity regions 6012 and 6013 are impurity regions for forming an LDD region (called Lov region in the present specification. It is noted that 'ov' means 'overlap') which overlaps with the gate electrode via the gate insulating film in the n-channel TFT of the CMOS circuit later. It is noted that the concentration of the impurity element giving the n-type and contained in the low concentrate impurity regions will be indicated as (n⁻) here. Accordingly, the low concentration impurity regions 6012 and 6013 may be said as n⁻ regions within the present specification.

Here, phosphorus was added by means of plasma excited ion doping method without mass-separating phosphine ($PH_3$). The ion implantation which involves the mass-separation may be used. In this process, phosphorus was added to the semiconductor layer under the gate insulating film 6007 via the gate insulating film 6007. Preferably, the concentration of phosphorus to be added was in a range of $5\times10^{17}$ to $5\times10^{18}$ atoms/cm$^3$ and was set at $1\times10^{18}$ atoms/cm$^3$ here.

After that, the resist masks 6008 through 6011 were removed and a thermal treatment of 1 to 12 hours was carried out within an nitrogen atmosphere in 400 to 900° C. or more preferably in 550 to 800° C. to activate the phosphorus added in this step.

[Forming Conductive Film for Gate Electrode and Wire: FIG. 8c]

A first conductive film 6014 was formed into a thickness of 10 to 100 nm by a conductive material whose main component is an element selected from titanium (Ti), tantalum (Ta), tungsten (W) and molybdenum (Mo). It is preferable to use tantalum nitride (TaN) or tungsten nitride (WN) for example as the first conductive film 6014. A second conductive film 6015 is then formed into a thickness of 100 to 400 nm by a conductive material mainly composed of either one of elements of Ta, Ti, Mo and W on the first conductive film 6014. For instance, Ta may be formed into a thickness of 200 nm. Although not shown, it is effective to form a silicon film of 2 to 20 nm thick under the first conductive film 6014 to prevent oxidation of the conductive films 6014 and 6015 (the conductive film 6015 in particular).

[Forming p-ch Gate Electrode and Wiring Electrode and Forming $p^{++}$ Region: FIG. 9A]

Resist masks 6016 through 6019 were formed to etch the first and second conductive films (hereinafter handled as a laminated film) to form a gate electrode 6020 and gate signal lines 6021 and 6022 of a p-channel type TFT. It is noted that conductive films 6023 and 6024 were left so as to cover the whole surface of the region which turns out to be the n-channel TFT.

Then, a process of doping impurity elements which give p-type at part of the semiconductor layer 6004 where the p-channel type TFT is to be formed was carried out by leaving the resist masks 6016 through 6019 as masks. Here, boron was doped as the impurity element by means of ion doping (ion implantation may be also used) by using diboran ($B_2H_6$). Here, boron was doped with concentration of $5\times10^{20}$ through $3\times10^{21}$ atoms/cm$^3$. It is noted that the concentration of the impurity element contained in the impurity region formed here and giving the p-type will be denoted as ($P^{++}$). Accordingly, the impurity regions 6025 and 6026 may be said as $P^{++}$ regions.

It is noted that the process of doping the impurity element giving the p-type may be carried out after etching the gate insulating film 6007 by using the resist masks 6016 through 6019 and exposing the part of the island semiconductor layer 6004. In this case, the island semiconductor film is less damaged and the throughput may be improved because the accelerating voltage may be low.

[Forming n-ch Gate Electrode: FIG. 9B]

Next, gate electrodes 6031 and 6032 of the n-channel type TFT were formed by forming resist masks 6027 through 6030 after removing the resist masks 6016 through 6019. At this time, the gate electrode 6031 was formed so as to overlap with the n$^-$ regions 6012 and 6013 via the gate insulating film.

[Forming n$^+$ Region: FIG. 9C]

Next, the resist masks 6027 through 6030 were removed and resist masks 6033 through 6035 were formed. Then, a process for forming an impurity region which functions as a source or drain region in the n-channel type TFT was conducted. The resist mask 6035 was formed so as to cover the gate electrode 6032 of the n-channel type TFT to form an LDD region so as not to overlap with the gate electrode in the n-channel type TFT of the pixel matrix circuit.

Then, impurity regions 6036 through 6040 were formed by doping the impurity element giving the n-type. Here, phosphorus was doped by means of ion doping (ion implantation may be also used) by using phosphine (PH$_3$). Here, phosphorus was doped with concentration of $1\times10^{20}$ through $1\times10^{21}$ atoms/cm$^3$. It is noted that the concentration of the impurity element contained in the impurity regions 6038 through 6040 formed here and giving the n-type will be denoted as (n$^+$). Accordingly, the impurity regions 6038 and 6040 may be said as n$^+$ regions. Further, because the n$^-$ region had been already formed, the impurity regions 6036 and 6037 contain phosphorus with the concentration a little higher than the impurity regions 6038 through 6040.

It is noted that the process of doping the impurity element giving the n-type may be carried out after etching the gate insulating film 6007 by using the resist masks 6033 through 6035 and the gate electrode 6031 as masks and exposing the part of the island semiconductor layers 6005 and 6006. In this case, the island semiconductor film is less damaged and the throughput may be improved because the accelerating voltage may be low.

[Forming n$^{--}$ Region: FIG. 10A]

Next, the resist masks 6033 through 6035 were removed and a process of doping the impurity element giving the n-type to the island semiconductor layer 6006 which turns out to be the n-channel type TFT of the pixel matrix circuit was carried out. Phosphorus of the same or less concentration with the above-mentioned n$^-$ region ($5\times10^{16}$ through $1\times10^{18}$ atoms/cm$^3$ in concrete) was doped to the impurity regions 6041 through 6044 thus formed. It is noted that the concentration of the impurity element contained in the impurity regions 6041 through 6044 formed here and giving the n-type will be denoted as (n$^{--}$). Accordingly, the impurity regions 6041 through 6044 may be said as the n$^{--}$ regions in the present specification. Although the phosphorus is doped to all of the impurity regions except of impurity regions 6068 and 6069 hidden by the gate electrode with the concentration of n$^-$ in this process, it may be neglected because its concentration is very low.

[Process of Thermal Activation: FIG. 10B]

Next, a protective insulating film 6045 which turns out to be a part of a first interlayer insulating film later was formed. The protective insulating film 6045 may be formed by a silicon nitride film, a silicon oxide film or a silicon nitride oxide film or a laminated film of them. Its thickness may be 100 to 400 nm.

After that, a heat treatment was carried out to activate the impurity element doped with the respective concentration and giving then- or p-type. This process may be carried out by means of furnace annealing, laser annealing or rapid thermal annealing (RTA). The activation process was carried out by means of the furnace annealing in this case. The heat treatment was carried out in a nitrogen atmosphere in 300 to 650° C. or preferably in 400 to 550° C., at 450° C. for two hours here.

Further, a heat treatment was carried out for 1 to 12 hours in 300 to 450° C. in an atmosphere containing hydrogen by 3 to 100% to carry out a process of hydrogenating the island semiconductor layer. This process is a step of terminating dangling bond of the semiconductor layer by the thermally excited hydrogen. Plasma hydrogenation (using hydrogen excited by plasma) may be used as other means of the hydrogenation.

[Forming Interlayer Insulating Film, Source/Drain Electrode, Shielding Film, Pixel Electrode and Holding Capacitor: FIG. 10C]

After ending the activation step, an interlayer insulating film 6046 of 0.5 to 1.5 μm thick was formed on the protective insulating film 6045. A laminated film of the protective insulating film 6045 and the interlayer insulating film 6046 was set as a first interlayer insulating film.

After that, contact holes reaching the source or drain regions of the respective TFTs were created to form source electrodes 6047 through 6049 and drain electrodes 6050 and 6051. Although not shown, these electrodes were formed by forming three-layered laminate film of 100 nm of Ti film, 300 nm of aluminum film containing Ti and 150 nm of Ti film continuously by sputtering. Then, it becomes the same state with that shown in FIG. 2. The activation layer 21 shown in FIG. 2 corresponds to the activation layers 6004 through 6006 in FIG. 10 and the gate signal line 22 and the drain wire 25 are represented as the drain electrodes 6050 and 6051 in the same manner. Source signal line 23 are represented as the source electrodes 6047 through 6049.

Next, a passivation film 6052 was formed into 50 to 500 nm of thickness (typically 200 to 300 nm) by a silicon nitride film, a silicon oxide film or a silicon nitride oxide film. Then, when a hydrogenation process was carried out in this condition, a result preferable for improving the characteristics of the TFT was obtained. Such result may be obtained by carrying out a heat treatment of 1 to 12 hours in 300 to 450° C. in an atmosphere containing hydrogen by 3 to 100% or by using the plasma hydrogenation. It is noted that an opening may be created through the passivation film 6052 at the position where a contact hole for connecting the pixel electrode with the drain electrode is created later.

After that, a second interlayer insulating film 6053 comprising organic resin was formed into a thickness of about 1 μm. Polyimide, acrylic, polyamide, polyimideamide, BCB (benzocyclobuten) and the like may be used as the organic resin. The use of the organic resin film is advantageous in that the film forming method is simplified, parasitic capacity may be reduced because the dielectric constant is low and it excels in the flatness. It is noted that other organic resin films or organic SiO compound may be used besides those described above. Here, the interlayer insulating film was formed by using polyimide of a thermal polymerization type and by sintering at 300° C. after applying to the substrate.

Next, a shielding film 6054 was formed on the second interlayer insulating film 6053 in the region which turns out to be the pixel matrix circuit. The shielding film 6054 was a film mainly composed either one of aluminum (Al), titanium (Ti) or Tantalum (Ta) and formed into a thickness of 100 to 300 nm. Then, an oxide film 6055 of 30 to 150 nm thick (preferably 50 to 75 nm) was formed on the surface of the shielding film 6054 by anode oxidation or plasma oxidation. Here, an aluminum film or a film mainly composed of aluminum was used as the shielding film 6054 and aluminum oxide film (alumina film) was used as the dielectric 6055.

It is noted that although the insulating film was provided on the surface of the shielding film here, the insulating film may be formed by means of vapor phase methods such as plasma CVD, thermal CVD or sputtering. The thickness is preferable to be 30 to 150 nm (or more preferably 50 to 75 nm) also in this case. A silicon oxide film, a silicon nitride film, a silicon nitride oxide film, a DLC (Diamond-Like Carbon) or an organic resin film may be also used. A laminated layer of them may be also used.

Next, a contact hole reaching to a drain electrode 6051 was created through the passivation film 6052 and the second interlayer insulating film 6053 to form a pixel electrode 6056. It is noted that pixel electrodes 6057 and 6058 are pixel electrodes of other pixels adjoining to each other, respectively. A transparent conductive film is used for the pixel electrodes 6056 through 6058 in creating a transmission type liquid crystal display and a metal film is used in creating a reflective type liquid crystal display. Here, indium tin oxide (ITO) film was formed into a thickness of 100 nm by means of sputtering to create the transmission type liquid crystal display.

At this time, the holding capacitor was formed at the region where the pixel electrode 6056 overlaps with the shielding film 6054 via the oxide film 6055.

Thus, the active matrix substrate having the CMOS circuit which turns out to be the driver circuit and the pixel matrix circuit on the same substrate was completed. It is noted that a p-channel type TFT 6081 and a n-channel type TFT 6082 were formed in the CMOS circuit which turns out to be the driver circuit and a pixel TFT 6083 composed of the n-channel type TFT was formed in the pixel matrix circuit.

A channel forming region 6062, a source region 6063 and a drain region 6064 were formed in the p-channel type TFT 6081 of the CMOS circuit as the $p^+$ regions, respectively. A channel forming region 6065, a source region 6066, a drain region 6067 and LDD regions (hereinafter called as Lov regions. 'ov' means 'overlap') 6068 and 6069 overlapping with the gate electrode via the gate insulating film were formed in the n-channel type TFT 6082. At this time, the source region 6066 and the drain region 6067 were formed in the ($n^-+n^+$) region and the Lov regions 6068 and 6069 were formed in the $n^-$ region, respectively.

Further, channel forming regions 6070 and 6071, a source region 6072, a drain region 6073 and LDD regions (hereinafter called as Loff regions. 'off' means 'offset') 6074 through 6077 not overlapping with the gate electrode via the gate insulating film and an $n^+$ region 6078 in contact with the Loff regions 6075 and 6076 were formed in the pixel TFT 6083. At this time, the source region 6072 and the drain region 6073 were formed in the $n^+$ region and the Loff regions 6074 through 6077 were formed in the $n^-$ region, respectively.

The length (width) of the Lov region may be set at 0.5 to 3.0 μm or typically 1.0 to 1.5 μm with respect to the channel length of 3 to 7 μm. The length (width) of the Loff regions 6074 through 6077 provided in the pixel TFT 6083 may be set at 0.5 to 3.5 μm, or typically 2.0 to 2.5 μm.

Figure 27:
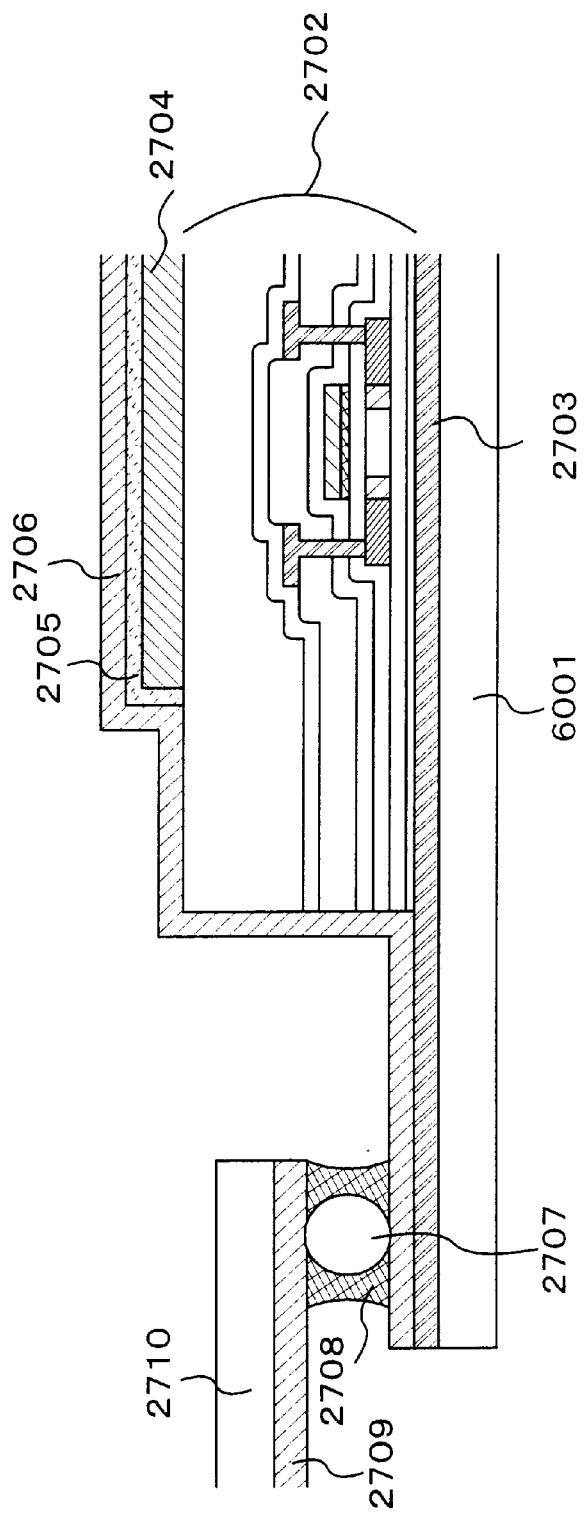
FIG. 27 is a section view of a joint part of a common line connected to ITO provided on a gate signal line driving circuit and a FPC output terminal.

FIG. 27 shows the joint part of the common line and a lead terminal from FPC. A substrate 6001, a gate signal line driving circuit 2702 having the n-channel type TFT shown in FIG. 10C, a common line 2703, a shielding film 2704, a dielectric 2705, an ITO film 2706, a filler 2707, resin 2708, an ITO film 2709 formed on the lead terminal from the FPC and a lead terminal 2710 from the FPC are provided as shown in FIG. 27.

A coupling capacitor is formed by the shielding film 2704, the ITO film 2706 and the dielectric 2705 sandwiched therebetween. The ITO film 2706 is provided on the gate signal line driving circuit 2702 and is connected with the common line 2703 provided under the gate signal line driving circuit 2702. The FPC side ITO film 2709 is formed on the lead terminal 271 from the FPC and the FPC side ITO film 2709 on the lead terminal 2710 from the FPC is connected with the ITO film 2706 by the filler 2707 and the resin 2708.

The resin may be photo-setting resin, thermo-setting resin or a mixture of the photo-setting and thermo-setting resins. When the mixture of the photo-setting resin and the thermo-setting resin is used, they are connected by heating and pressing after adhering temporarily by light. The filler must be a conductive material. Two or more fillers having different sizes may be used. In this case, the smaller filler needs not be conductive because it functions as a spacer and the larger filler must be conductive because it connects them electrically.

According to the present invention, the liquid crystal is driven by the source line inversion and the shielding film is not connected to the common line whose potential is kept at the fixed potential (reference potential). Because the potential of the shielding film is kept constant by the source line inversion when averaged temporally, it becomes possible to float the shielding film in the holding capacitor having the structure in which the dielectric is sandwiched between the shielding film and the pixel electrode. Accordingly, it becomes unnecessary to create a contact hole by means of photolithography using a mask through the interlayer insulating film provided between the shielding film and the common line in order to connect the shielding film with the common line. Therefore, it becomes possible to reduce the number of fabrication steps, to achieve the high yield and to suppress the fabrication cost of the active matrix liquid crystal display.

[Second Embodiment]

In addition to the arrangement of floating the shielding film in the first embodiment, an example of forming a large capacity coupling capacitor between the shielding film and the common line will be explained in the present embodiment.

Figure 11:
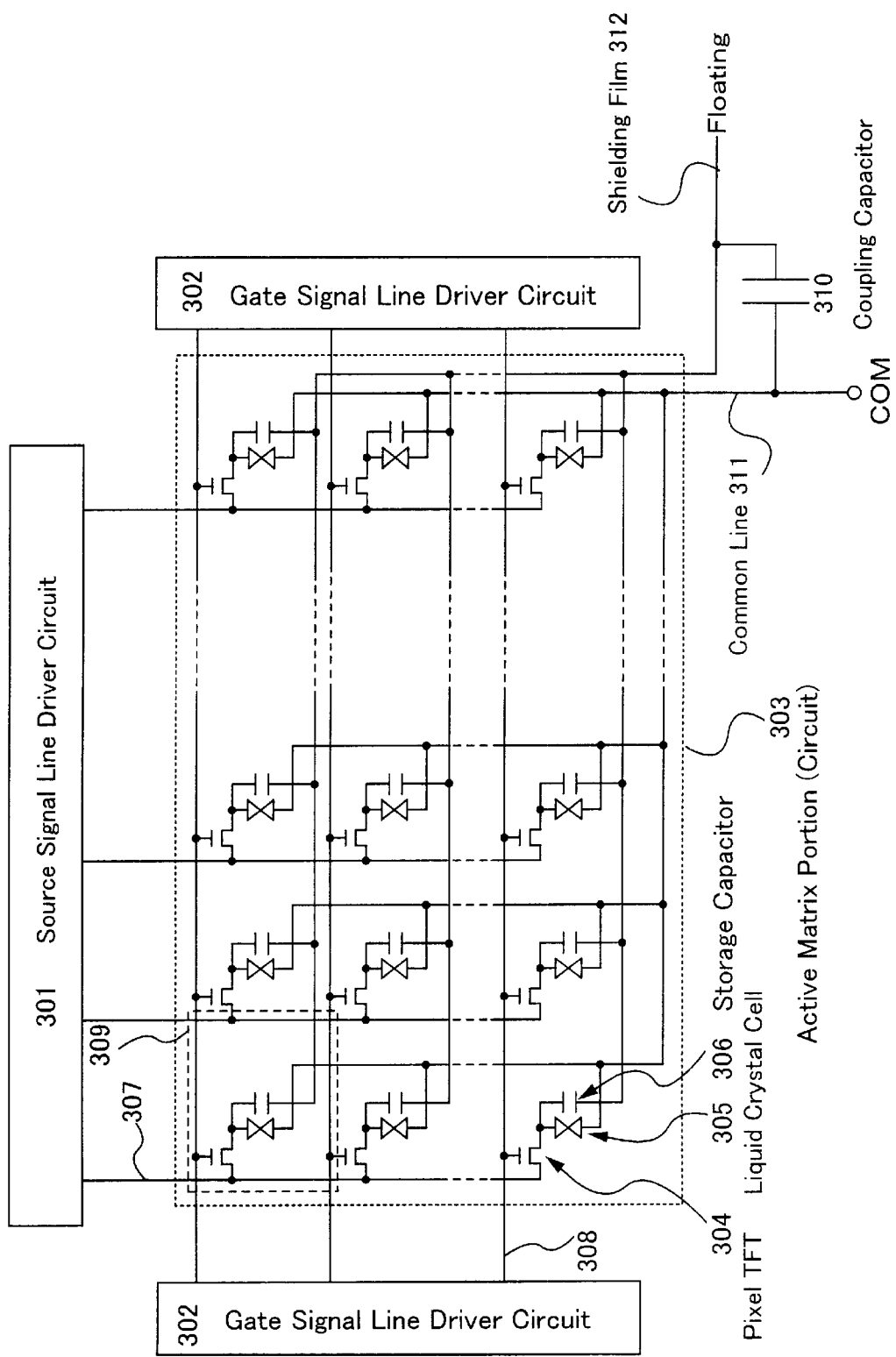
FIG. 11 is a circuit diagram of an inventive active matrix circuit.

FIG. 11 shows one example of a circuit diagram of the inventive active matrix circuit using a holding capacitor. Provided as shown in FIG. 11 are a source signal line driving circuit 301, a gate signal line driving circuit 302, an active matrix circuit 303, a pixel TFT 304, liquid crystal cells 305 sandwiching liquid crystal between a pixel electrode and an opposed electrode, a holding capacitor 306 formed by sandwiching dielectric between the pixel electrode and a shielding film, a source signal line 307 and a gate signal line 308. A coupling capacitor 310 is also provided between a shielding film in the floating condition and a common line. The source signal line driving circuit 301 and the gate signal line driving circuit 302 are called as driving circuits in general. These driving circuits are formed on the same substrate as the active matrix section (circuit).

In the active matrix section 303, the source signal line 307 connected to the source signal line driving circuit 301 crosses with the gate signal line 308 connected to the gate signal line driving circuit 302. The pixel thin film transistor (pixel TFT) 304, the liquid crystal cell 305 sandwiching the liquid crystal between the opposed electrode and the pixel electrode and the holding capacitor 306 are provided in the region surrounded by the source signal line 307 and the gate signal line 308, i.e., in a pixel section 309.

The holding capacitor 306 is constructed by sandwiching an oxide film as the dielectric between the pixel electrode and the shielding film 312 and all the shielding films 312 are put into the floating state in which they are not connected to the common lines 311.

The capacity of the coupling capacitor 310 is enough if it is ten times or more of the total of capacity of all holding capacitors connected to one gate signal line via the pixel TFTs.

The pixel TFT 304 selects an image signal inputted to the source signal line 307 to write into a predetermined pixel electrode.

The image signal sampled by a timing signal outputted from the source signal line driving circuit 301 is supplied to the source signal line 307.

The pixel TFT 304 operates by a selection signal inputted from the gate signal line driving circuit 302 via the gate signal line 308.

The image signal inputted to the source signal line is applied by inverting the polarity thereof per one line of the source signal line and the polarity of the signals is inverted per each one frame period to prevent the liquid crystal from deteriorating by always applying the electric field of one orientation to the liquid crystal. Thus, the liquid crystal is driven by way of source line inversion and the shielding film is put into the floating state without connecting to the common line. The potential of the shielding film may be kept constant when averaged temporally by constructing as described above without connecting the shielding film to the common line, so that the holding capacitor having the structure in which the dielectric is sandwiched between the shielding film and the pixel electrode may be formed. Accordingly, it becomes unnecessary to create a contact hole by means of photolithography using a mask through an interlayer insulating film provided between the shielding film and the common line to connect the shielding film with the common line. Thereby, it becomes possible to reduce a number of fabrication steps, to achieve a high yield and to suppress the fabrication cost of the active matrix liquid crystal display. In addition to that, the fluctuation $\Delta V$ of the potential of the shielding film is reduced by floating the shielding film and by forming a large capacity coupling capacitor between the shielding film and the common line. The greater the capacity of the coupling capacitor, the smaller the $\Delta V$ becomes, thus allowing the potential of the shielding film to be kept more constant and a good contrast to be obtained.

Figure 23A:
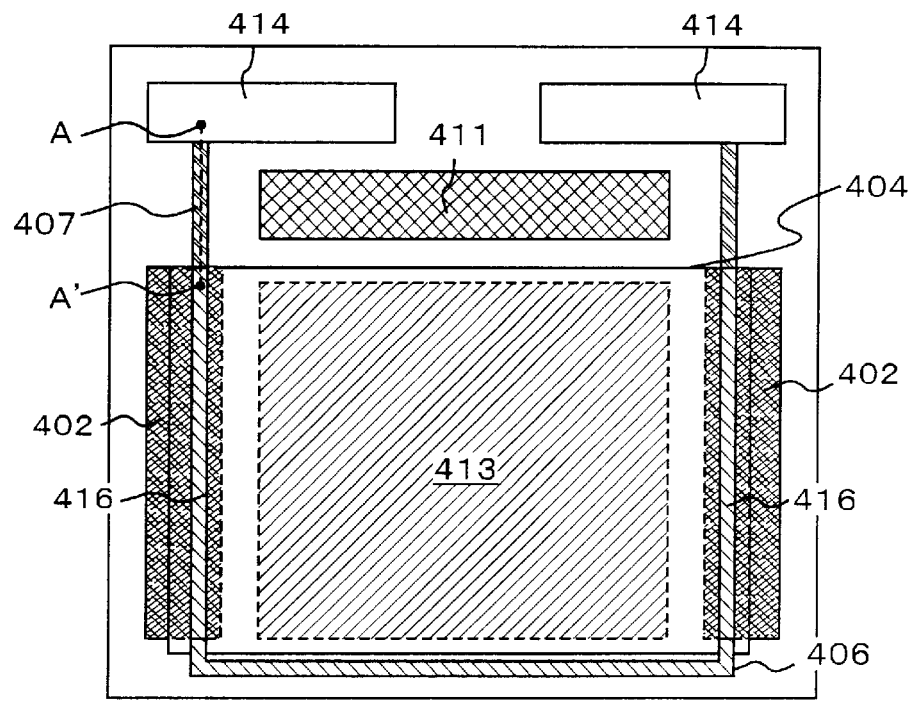
FIGS. 23A and 23B are section and plan views of an inventive active matrix circuit.
Figure 23B:
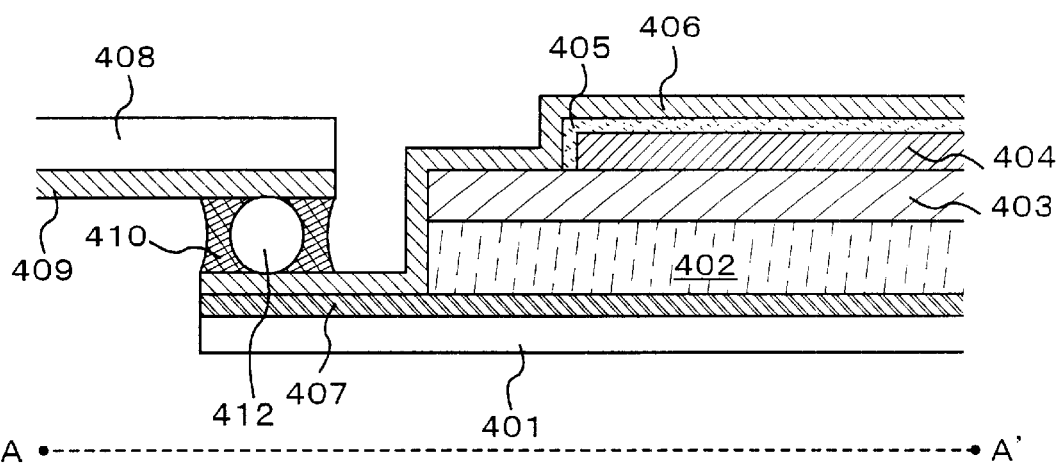

FIGS. 23A and 23B are schematic plan and section views of the circuit shown in FIG. 11. FIG. 23B is a section view along A–A' in FIG. 23A.

A source signal line driving circuit 411 (301 in FIG. 11), a gate signal line driving circuit 402, an active matrix section 413 (303 in FIG. 11), a shielding film 404, an ITO film 406, a common line 407 an FPC 414 are provided as shown in FIG. 23A.

The ITO film 406 is electrically connected with the common line 407 and the common line 407 is connected to the outside of the substrate by the FPC 414 to be kept at constant potential (reference potential).

The coupling capacitor 416 (310 in FIG. 11) is formed at the part where the ITO film 406 connected to the common line 407 overlaps with the shielding film 404.

A substrate 401, the gate signal line driving circuit 402 (302 in FIG. 11), an interlayer insulating film 403, the shielding film 404, dielectric 405, the ITO film 406, the common line 407, a filler 412, resin 410, an ITO film 409 formed on the lead terminal from the FPC and a lead terminal 408 from the FPC are provided as shown in FIG. 23.

The coupling capacitor is formed by the shielding film 404, the ITO film 406 and the dielectric 405 sandwiched therebetween. The ITO film 406 is provided on the gate signal line driving circuit 402 and is connected with the common line 407 provided under the gate signal line driving circuit 402. The FPC side ITO film 409 is formed on the lead terminal 408 from the FPC in contact therewith and the FPC side ITO film 409 on the lead terminal 408 from the FPC is connected with the ITO film 406 by the filler 412 and the resin 410.

The resin 410 may be photo-setting resin, thermo-setting resin or a mixture of the photo-setting and thermo-setting resins. When the mixture of the photo-setting resin and the thermo-setting resin is used, they are connected by heating and pressing after adhering temporarily by light. The filler must be a conductive material. Two or more fillers having different sizes may be used. In this case, the smaller filler needs not be conductive because it functions as a spacer and the larger filler must be conductive because it connects them electrically.

The ITO film 406 is electrically connected with the common line 407. The coupling capacitor 310 shown in FIG.

11 is formed by the ITO film 406 connected to the common line 407, the shielding film 404 and the dielectric 405 provided therebetween.

Results of simulation of the pixel potential when the shielding film is put into the floating condition and the large capacity coupling capacitor is formed between the shielding film and the common line will be explained with reference to FIGS. 12, 25 and 26.

Figure 12A:
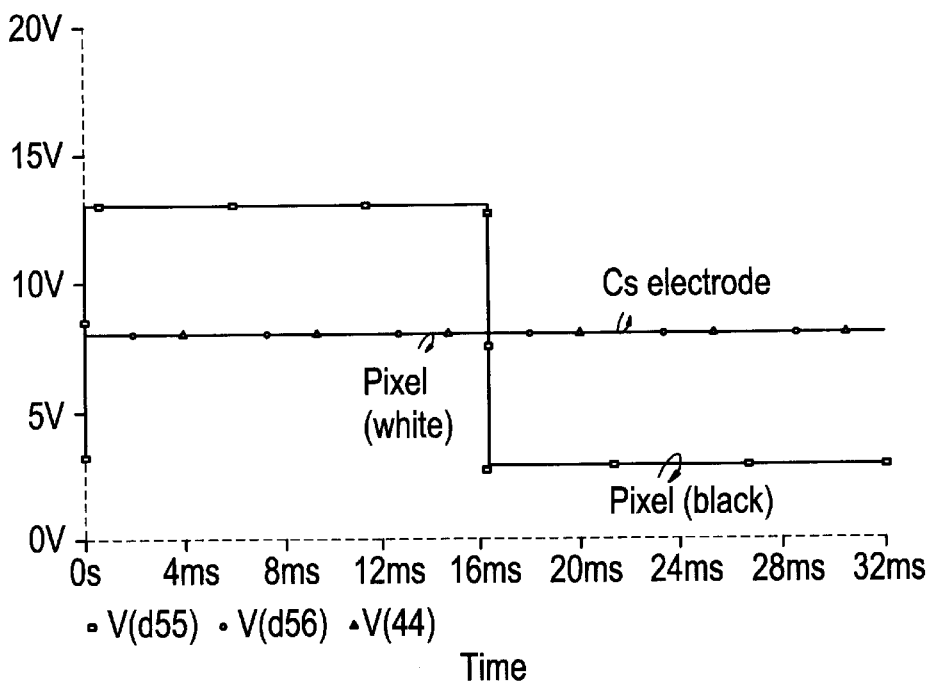
FIGS. 12A and 12B are charts showing simulation results of the invention.

FIG. 12A shows the result of simulation of electrode waveform of the pixel electrode when white and black stripes are displayed per each source line on the active matrix liquid crystal display in which the shielding film is put into the floating condition and the large capacity coupling capacitor is formed between the shielding film and the common line. The simulation was carried out by supposing that a number of pixels is 10×10 and a coupling capacitor of 300 nF of capacity is formed on all of the gate signal line driving circuit. FIG. 12A is a chart of the electrode waveform of the center of the screen or of the pixel electrode adjoining thereto. 0 ms through 16 ms represents the pixel potential when the first screen was displayed and 16 ms through 32 ms represents the pixel potential when the second screen was displayed. Signals of ±5 V is applied to the pixel electrode based on 8 V of pixel potential.

Figure 25:
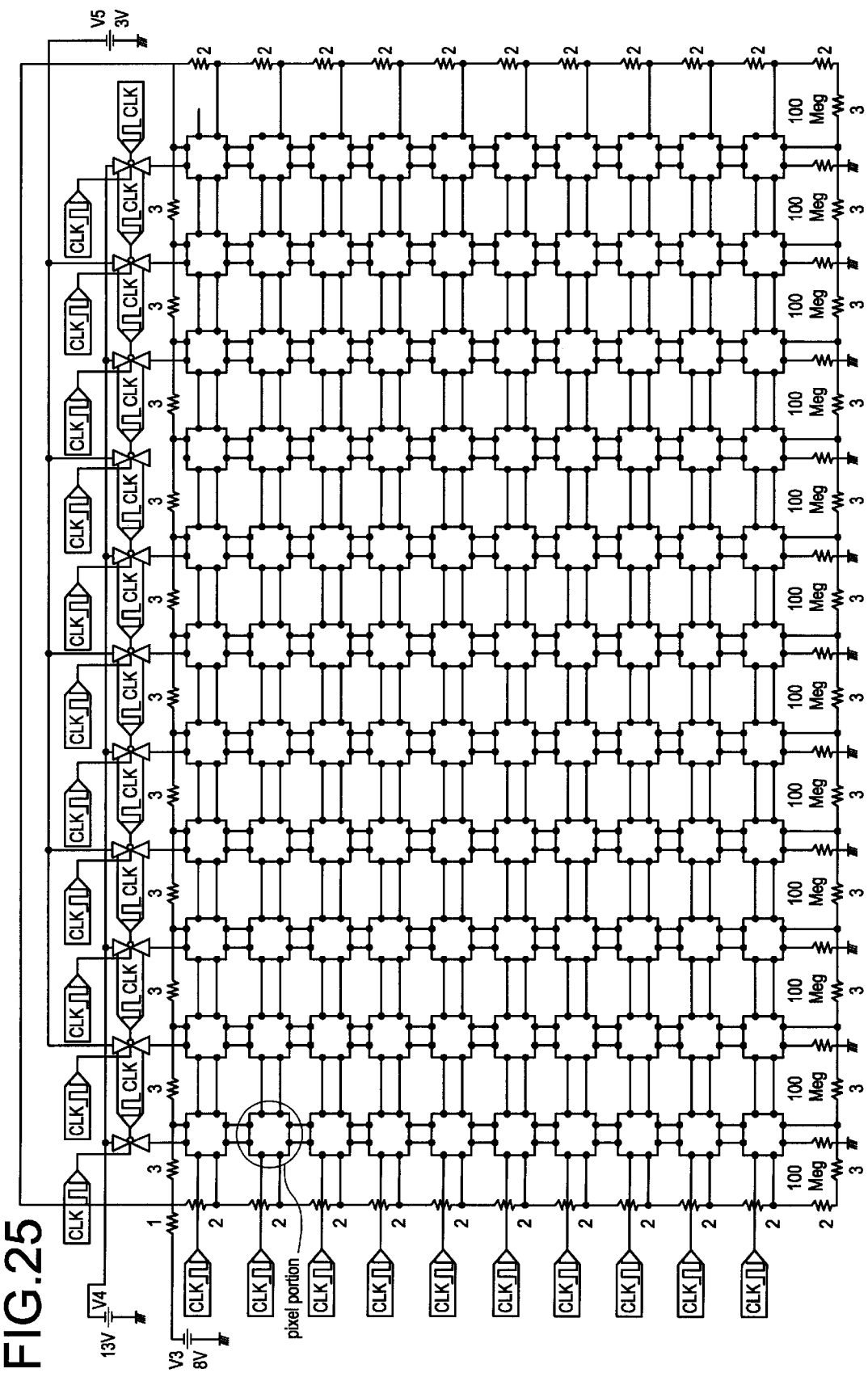
FIG. 25 is a circuit diagram which was the model of the simulation of the active matrix substrate in FIG. 12.
Figure 26:
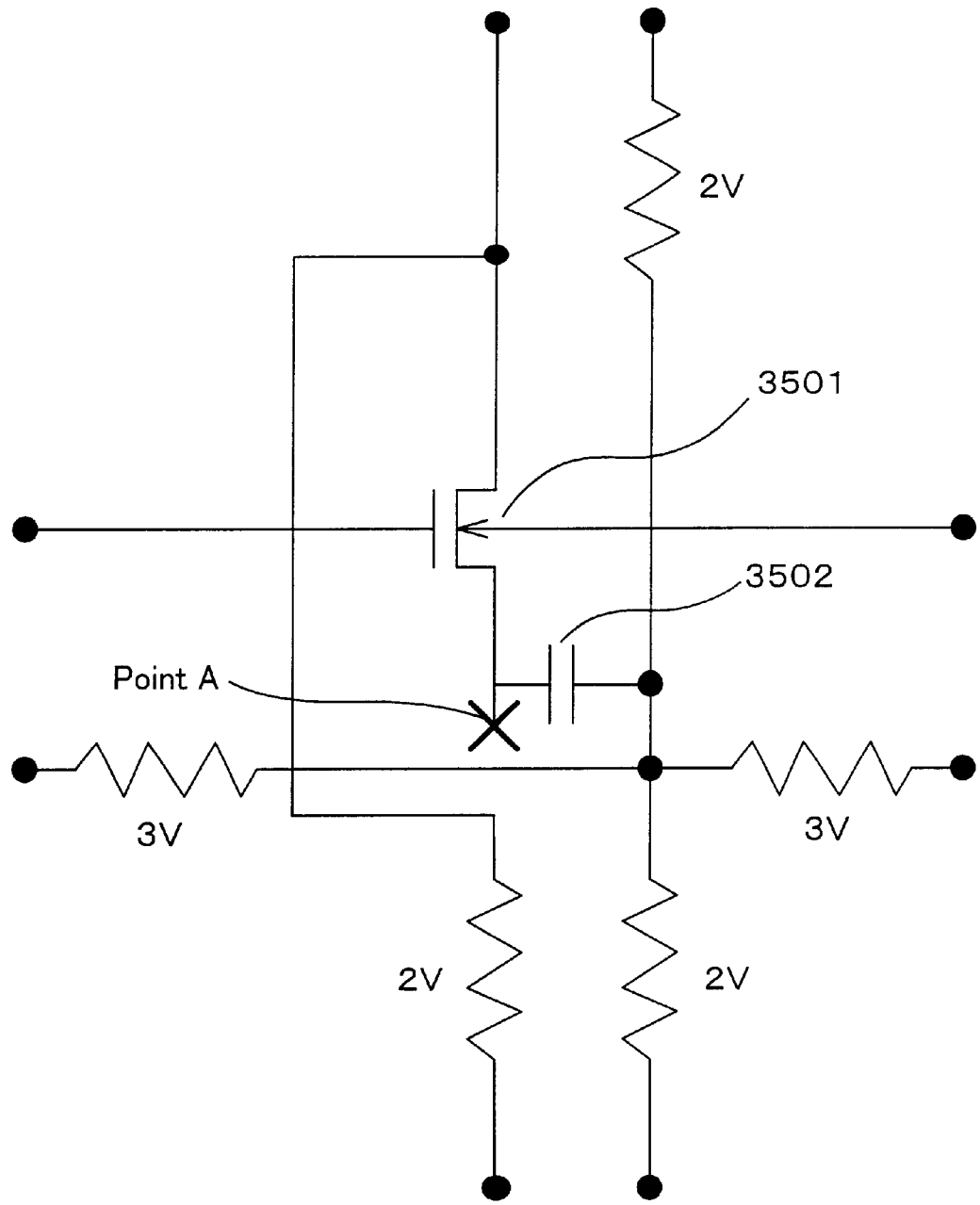
FIG. 26 is a detailed circuit diagram of the pixel section in FIG. 25. A pixel TFT 3501 and a coupling capacitor 3502 are provided as shown in FIG. 26. The simulation result shown in FIG. 12 is what the potential at point A in FIG. 26 has been measured.

FIG. 25 is a circuit diagram which was the model of the simulation of the active matrix substrate in FIG. 12. FIG. 26 is a detailed circuit diagram of the pixel section in FIG. 25. A pixel TFT 3501 and a coupling capacitor 3502 are provided as shown in FIG. 26. The simulation result shown in FIG. 12 is what the potential at point A in FIG. 26 has been measured.

Figure 12B:
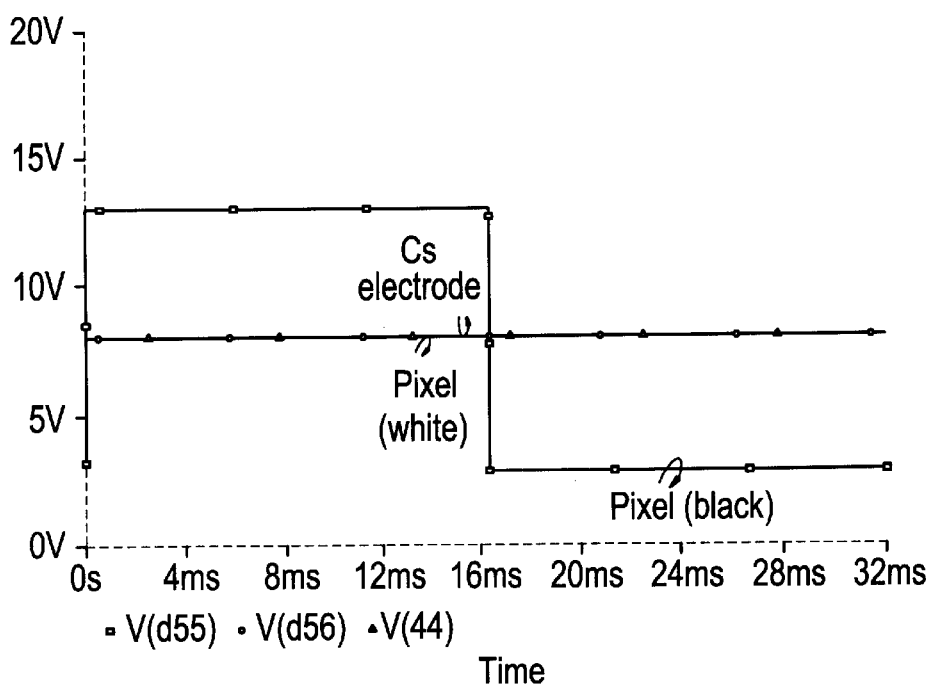

FIG. 12B shows the result of simulation when the shielding film is not put into the floating condition and is connected to the common line (COM) of low resistance (1) to keep at the reference potential for comparison.

It can be seen when FIG. 12A is compared with FIG. 12B that almost the same simulation results could be obtained. That is, it was found that no fluctuation of the pixel potential is seen even when the shielding film is not connected to the common line and is put into the floating condition and when the coupling capacitor is provided between the shielding film and the common line and that it is possible to display images in the same degree with the case of not floating the shielding film and of connecting to the common line (COM) to keep at the reference potential. Accordingly, it becomes possible to reduce a number of fabrication steps for creating the contact hole through the interlayer insulating film provided between the shielding film and the common line by means of photolithography using masks, to achieve a high yield and to suppress the fabrication cost thereof without degrading the image quality.

[Third Embodiment]

Besides the method shown in Embodiment 1, another example for fabricating the pixel matrix circuit and the TFTs of the driver circuits provided around that in the same time will be explained with reference to FIGS. 13 through 15. The process disclosed in this embodiment can be used for the fabrication of the semiconductor device of the present invention.

[Process for Forming Island Semiconductor Layer and Gate Insulating Film: FIG. 13A]

In FIG. 13A, it is desirable to use anon-alkali glass substrate or a quartz substrate as a substrate 7001. Beside them, the substrate may be a silicon substrate or a metal substrate on which an insulating film is formed.

An under layer film made of a silicon oxide film, a silicon nitride film or a silicon nitride oxide film was formed into a thickness of 100 to 400 nm on the surface of the substrate 7001 where the TFTs are to be formed by means of plasma CVD or sputtering. The under layer film 7002 maybe formed into the double-layer structure of the silicon nitride film 7002 of 25 to 100 nm thick, or 50 nm here, and of the silicon oxide film 7003 of 50 to 300 nm, or 150 nm here. The underlayer film is provided to prevent contamination of impurity from the substrate and needs not be provided always when the quartz substrate is used.

Next, an amorphous silicon film of 20 to 100 nm thick was formed on the underlayer film by means of publicly known film forming method. Although it depends on the hydrogen content, it is preferable to carry out the crystallization process after reducing the hydrogen content below 5 atom % by heating several hours preferably in 400 to 550° C. to dehydrogenate it. Although the amorphous silicon film may be formed by another fabrication method such as sputtering or evaporation, it is desirable to sufficiently reduce impurity elements such as oxygen and nitrogen contained in the film. Here, the underlayer film and the amorphous silicon film may be formed continuously because they may be formed by the same film forming method. It is possible to prevent the contamination of the surface and to reduce the dispersion of characteristics of the fabricated TFTs by not exposing the underlayer film to the atmosphere once after forming it.

The process for forming the crystalline silicon film from the amorphous silicon film may be carried out by using the publicly known laser crystallization or thermal crystallization method. The crystalline silicon film may be fabricated by means of thermal crystallization by using a catalyst element which promote the crystallization of silicon. Besides them, a micro-crystal silicon film may be used or a crystalline silicon film may be directly deposited. The crystalline silicon film may be also formed by using the publicly known technology of SOI (Silicon On Insulators) by which monocrystal silicon is pasted on the substrate.

The island semiconductor layers 7004 through 7006 were formed by etching unnecessary parts of the crystalline silicon film thus formed. Boron (B) may be added at concentration of $1\times10^{15}$ to $5\times10^{17}$ cm$^{-3}$ in advance in order to control threshold voltage in the region of the crystalline silicon film where the n-channel type TFT is to be fabricated.

Next, a gate insulating film 7007 whose main component is silicon oxide or silicon nitride was formed so as to cover the island semiconductor layers 7004 through 7006. The gate insulating film 7007 is formed into a thickness of 10 to 200 nm or more preferably from 50 to 150 nm. For instance, a silicon nitride oxide film whose raw materials are $N_2O$ and $SiH_4$ and whose thickness is 75 nm is formed by means of plasma CVD. Then, it is thermally oxidized in 800 to 1000° C. within oxygen atmosphere or mixed atmosphere of oxygen and hydrochloric acid to form the gate insulating film of 115 nm (FIG. 13A).

[Forming n⁻ Region: FIG. 13B]

Resist masks 7008 through 7011 were formed on the whole surface of the region where the island semiconductor layers 7004 and 7006 and the wires are to be formed and at part of the island semiconductor layer 7005 (including the region which turns out to be a channel forming region) and impurity element giving the n-type was added to form a low concentration impurity region 7012. The low concentration impurity region 7012 is an impurity region for forming an LDD region which overlaps with the gate electrode (called Lov region in the present specification. It is noted that 'ov' means 'overlap') via the gate insulating film in the n-channel TFT of the CMOS circuit later. It is noted that the concentration of the impurity element giving the n-type and contained in the low concentrate impurity region will be indicated as (n⁻) here. Accordingly, the low concentrate impurity region 7012 may be said as an n⁻ region within the present specification.

Here, phosphorus was added by means of plasma excited ion doping method without mass-separating phosphine ($PH_3$). The ion plantation which involves the mass-separation may be used if desired. In this process, phosphorus was added to the semiconductor layer under the gate insulating film 7007 via the gate insulating film 7007. Preferably, the concentration of phosphorus to be added was in a range of $5 \times 10^{17}$ to $5 \times 10^{18}$ atoms/cm³ and was set at $1 \times 10^{18}$ atoms/cm³ here.

After that, the resist masks 7008 through 7011 were removed and a thermal treatment of 1 to 12 hours was carried out within a nitrogen atmosphere in 400 to 900° C., or more preferably in 550 to 800° C. to activate the phosphorus added in this step.

[Forming Conductive Film for Gate Electrode and Wire: FIG. 13C]

A first conductive film 7013 was formed into a thickness of 10 to 100 nm by a conductive material whose main component is an element selected from titanium (Ti), tantalum (Ta), tungsten (W) and molybdenum (Mo). It is preferable to use tantalum nitride (TaN) or tungsten nitride (WN) for example as the first conductive film 7013. A second conductive film 7014 is then formed into a thickness of 100 to 400 nm by a conductive material mainly composed of either one of elements of Ta, Ti, Mo and W on the first conductive film 7013. For instance, Ta may be formed into a thickness of 200 nm. Although not shown, it is effective to form a silicon film of 2 to 20 nm thick under the first conductive film 7013 to prevent oxidation of the conductive films 7013 and 7014 (the conductive film 7014 in particular).

[Forming p-ch Gate Electrode and Wiring Electrode and Forming p⁺⁺ Region: FIG. 14A]

Resist masks 7015 through 7018 were formed to etch the first and second conductive films (hereinafter handled as a laminated film) to form a gate electrode 7019 and gate signal lines 7020 and 7021 of a p-channel type TFT. It is noted that conductive films 7022 and 7023 were left so as to cover the whole surface of the region which turns out to be the n-channel TFT.

Then, a process of doping impurity elements which give the p-type at part of the semiconductor layer 7004 where the p-channel type TFT is to be formed was carried out by leaving the resist masks 7015 through 7018 as they are as masks. Here, boron was doped as the impurity element by means of ion doping (ion implantation may be also used) by using diboran ($B_2H_6$). Here, boron was doped with concentration of $5 \times 10^{20}$ to $3 \times 10^{21}$ atoms/cm³. It is noted that the concentration of the impurity element contained in the impurity region formed here and giving the p-type will be denoted as (P⁺⁺). Accordingly, the impurity regions 7024 and 7025 may be said as P⁺⁺ regions.

It is noted that the process of doping the impurity element giving the p-type maybe carried out after etching the gate insulating film 7007 by using the resist masks 7015 through 7018 and exposing the part of the island semiconductor layer 7004. In this case, the island semiconductor film is less damaged and the throughput may be improved because the accelerating voltage may be low.

[Forming n-ch Gate Electrode: FIG. 14B]

Next, gate electrodes 7030 and 7031 of the n-channel type TFT were formed by forming resist masks 7026 through 7029 after removing the resist masks 7015 through 7018. At this time, the gate electrode 7030 was formed so as to overlap with the n⁻ region 7012 via the gate insulating film.

[Forming n⁺ Region: FIG. 14C]

Next, the resist masks 7026 through 7029 were removed and resist masks 7032 through 7034 were formed. Then, a process for forming an impurity region which functions as a source or drain region in the n-channel type TFT was carried out. A resist mask 7034 was formed so as to cover the gate electrode 7031 of the n-channel type TFT to form an LDD region so as not to overlap with the gate electrode in the n-channel type TFT of the pixel matrix circuit in the later process.

Then, impurity regions 7035 through 7039 were formed by doping the impurity element giving the n-type. Here, phosphorus was doped by means of ion doping (ion implantation may be also used) by using phosphine ($PH_3$). Here, phosphorus was doped with concentration of $1 \times 10^{20}$ through $1 \times 10^{21}$ atoms/cm³. It is noted that the concentration of the impurity element contained in the impurity regions 7037 through 7039 formed here and giving the n-type will be denoted as (n⁺). Accordingly, the impurity regions 7037 and 7039 may be said as n⁺ regions. Further, because the n⁻ region had been already formed, strictly speaking, the impurity regions 7035 contains phosphorus with the concentration a little higher than that of the impurity regions 7037 through 7039.

It is noted that the process of doping the impurity element giving the n-type may be carried out after etching the gate insulating film 7007 by using the resist masks 7032 through 7034 and the gate electrode 7030 as masks and by exposing the part of the island semiconductor layers 7005 and 7006. In this case, the island semiconductor film is less damaged and the throughput may be improved because the accelerating voltage may be low.

[Forming n⁻⁻ Region: FIG. 15A]

Next, the resist masks 7032 through 7034 were removed and a process of doping the impurity element giving the n-type to the island semiconductor layer 7006 which turns out to be the n-channel type TFT of the pixel matrix circuit was carried out. Phosphorus of the same or less concentration with the above-mentioned n⁻ region ($5 \times 10^{16}$ to $1 \times 10^{18}$ atoms/cm³ in concrete) was doped to the impurity regions 7040 through 7043 thus formed. It is noted that the concentration of the impurity element contained in the impurity regions 7040 through 7043 formed here and giving the n-type will be denoted as (n⁻⁻). Accordingly, the impurity regions 7040 through 7043 may be said as the n⁻⁻ regions in the present specification. Although the phosphorus is doped to all of the impurity regions except of an impurity region 7067 hidden by the gate electrode with the concentration of n⁻ in this process, it may be neglected because its concentration is very low.

[Process of Thermal Activation: FIG. 15B]

Next, a protective insulating film 7044 which turns out to be a part of a first interlayer insulating film later was formed. The protective insulating film 7044 may be formed by a silicon nitride film, a silicon oxide film or a silicon nitride oxide film or a laminated film of them. Its thickness may be 100 to 400 nm.

After that, a heat treatment was carried out to activate the impurity element doped with the respective concentration and giving the n- or p-type. This process may be carried out by means of furnace annealing, laser annealing or rapid thermal annealing (RTA). The activation process was carried out by means of the furnace annealing in this case. The heat treatment was carried out in a nitrogen atmosphere in 300 to 650° C. or preferably in 400 to 550° C., and here at 450° C. here for two hours.

Further, a heat treatment was carried out for 1 to 12 hours in 300 to 450° C. in an atmosphere containing hydrogen by 3 to 100% to carry out a process of hydrogenating the island semiconductor layer. This process is a step of terminating dangling bond of the semiconductor layer by the thermally excited hydrogen. Plasma hydrogenation (using hydrogen excited by plasma) may be used as other means of the hydrogenation.

[Forming Interlayer Insulating Film, Source/Drain Electrode, Shielding Film, Pixel Electrode and Holding Capacitor: FIG. 15C]

After ending the activation step, an interlayer insulating film 7045 of 0.5 to 1.5 µm thick was formed on the protective insulating film 7044. A laminated film composed of the protective insulating film 7044 and the interlayer insulating film 7045 was set as a first interlayer insulating film.

After that, contact holes reaching the source or drain regions of the respective TFTs were created to form source electrodes 7046 through 7048 and drain electrodes 7049 and 7050. Although not shown, these electrodes were formed by forming three-layered laminate film of 100 nm of Ti film, 300 nm of aluminum film containing Ti and 150 nm of Ti film continuously by sputtering.

Next, a passivation film 7051 was formed into 50 to 500 nm of thickness (typically 200 to 300 nm) by a silicon nitride film, a silicon oxide film or a silicon nitride oxide film. Then, when a hydrogenation process was carried out in this condition, a result preferable for improving the characteristics of the TFT was obtained. Such result may be obtained by carrying out a heat treatment of 1 to 12 hours in 300 to 450° C. in an atmosphere containing hydrogen by 3 to 100% or by using the plasma hydrogenation. It is noted that an opening may be created through the passivation film 7051 at the position where a contact hole for connecting the pixel electrode with the drain electrode later is created.

After that, a second interlayer insulating film 7052 made of organic resin was formed into a thickness of about 1 µm. Polyimide, acrylic, polyamide, polyimideamide, BCB (benzocyclobuten) and the like may be used as the organic resin. The use of the organic resin film is advantageous in that the film forming method is simplified, parasitic capacity may be reduced because the dielectric constant is low and it excels in the flatness. It is noted that other organic resin films or organic SiO compounds may be used besides those described above. Here, the interlayer insulating film was formed by using polyimide of a thermal polymerization type and by sintering at 300° C. after applying to the substrate.

Next, a shielding film 7053 was formed on the second interlayer insulating film 7052 in the region which turns out to be the pixel matrix circuit. The shielding film 7053 was a film mainly composed either one of aluminum (Al), titanium (Ti) or tantalum (Ta) and formed into a thickness of 100 to 300 nm. Then, an oxide film 7054 of 30 to 150 nm thick (preferably 50 to 75 nm) was formed on the surface of the shielding film 7053 by anode oxidation or plasma oxidation. Here, an aluminum film or a film mainly composed of aluminum was used as the shielding film 7053 and aluminum oxide film (alumina film) was used as the dielectric 7054.

It is noted that although the insulating film was provided on the surface of the shielding film here, the insulating film may be formed by means of vapor phase methods such as plasma CVD, thermal CVD or sputtering. The thickness is preferable to be 30 to 150 nm (or more preferably 50 to 75 nm) also in this case. A silicon oxide film, a silicon nitride film, a silicon nitride oxide film, a DLC (Diamond-Like Carbon) or an organic resin film may be also used. A laminated layer of them may be also used.

Next, a contact hole reaching to a drain electrode 7050 was created through the second interlayer insulating film 7052 to form a pixel electrode 7055. It is noted that pixel electrodes 7056 and 7057 are pixel electrodes of other pixels adjoining to each other, respectively. A transparent conductive film is used for the pixel electrodes 7055 through 7057 in creating a transmission type liquid crystal display and a metal film is used in creating a reflective type liquid crystal display. Here, indium tin oxide (ITO) film was formed into a thickness of 100 nm by means of sputtering to create the transmission type liquid crystal display.

At this time, the holding capacitor was formed at the region 7058 where the pixel electrode 7055 overlaps with the shielding film 7053 via the oxide film 7054.

Thus, the active matrix substrate having the CMOS circuit which turns out to be the driver circuit and the pixel matrix circuit on the same substrate was completed. It is noted that a p-channel type TFT 7081 and an n-channel type TFT 7082 were formed in the CMOS circuit which turns out to be the driver circuit and a pixel TFT 7083 composed of the n-channel type TFT was formed in the pixel matrix circuit.

A channel forming region 7061, a source region 7062 and a drain region 7063 were formed in the p-channel type TFT 7081 of the CMOS circuit as the $p^+$ regions, respectively. A channel forming region 7064, a source region 7065, a drain region 7066 and a LDD region 7067 overlapping with the gate electrode (hereinafter called as Lov region. 'ov' means 'overlap') via the gate insulating film were formed in the n-channel type TFT 7082. At this time, the source region 7065 and the drain region 7066 were formed in the $(n^-+n^+)$ region and the Lov region 7067 was formed in the $n^-$ region, respectively.

Further, channel forming regions 7068 and 7069, a source region 7070, a drain region 7071 and LDD regions 7072 through 7075 not overlapping with the gate electrode (hereinafter called as Loff regions. 'off' means 'offset') via the gate insulating film and an $n^+$ region 7076 in contact with the Loff regions 7073 and 7074 were formed in the pixel TFT 7083. At this time, the source region 7070 and the drain region 7071 were formed in the $n^+$ region and the Loff regions 7072 through 7075 were formed in the $n^-$ region, respectively.

The length (width) of the Lov region may be set at 0.5 to 3.0 µm or typically 1.0 to 1.5 µm with respect to the channel length of 3 to 7 µm. The length (width) of the Loff regions 7072 through 7075 provided in the pixel TFT 7083 may be set at 0.5 to 3.5 µm, or typically at 2.0 to 2.5 µm.

Figure 28:
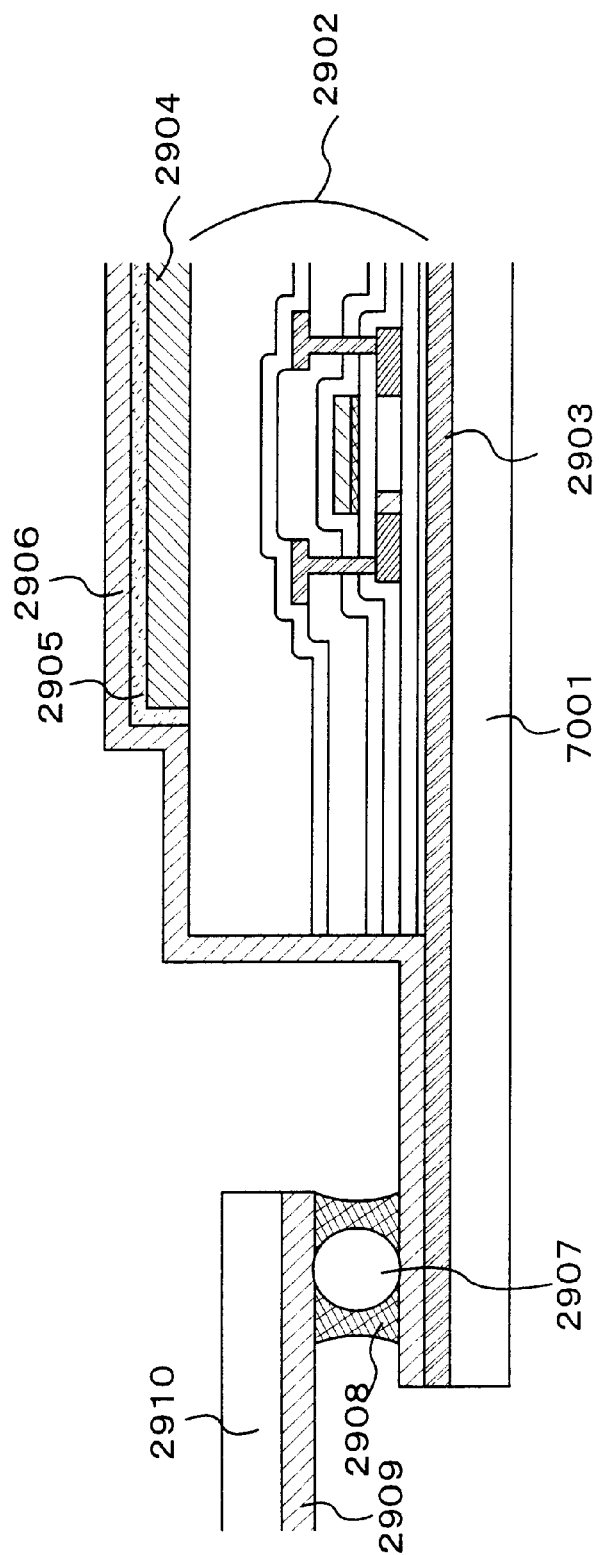
FIG. 28 is a section view of another joint part of the common line connected to ITO provided on the gate signal line driving circuit and the FPC output terminal.

FIG. 28 shows the joint part of the common line and a lead terminal from FPC. A substrate 7001, a gate signal line driving circuit 2902 having the n-channel type TFT shown in FIG. 15C, a common line 2903, a shielding film 2904, a dielectric 2905, an ITO film 2906, a filler 2907, resin 2908, an ITO film 2909 formed on the lead terminal from the FPC and a lead terminal 2910 from the FPC are provided as shown in FIG. 28.

A coupling capacitor is formed by the shielding film 2904, the ITO film 2906 and the dielectric 2905 sandwiched therebetween. The ITO film 2906 is provided over the gate signal line driving circuit 2902 and is connected with the common line 2903 provided under the gate signal line driving circuit 2902. The FPC side ITO film 2909 is formed on the lead terminal 2910 from the FPC and the FPC side ITO film 2909 on the lead terminal 2910 from the FPC is connected with the ITO film 2906 by the filler 2907 and the resin 2908.

The resin 2908 maybe photo-setting resin, thermo-setting resin or a mixture of the photo-setting and thermosetting resins. When the mixture of the photo-setting resin and the thermo-setting resin is used, they are connected by heating and pressing after adhering temporarily by light. The filler must be a conductive material. Two or more fillers having different sizes may be used. In this case, the smaller filler needs not be conductive because it functions as a spacer and the larger filler must be conductive because it connects them electrically.

According to the present invention, the liquid crystal is driven by the source line inversion and the shielding film is not connected to the common line whose potential is kept at the fixed potential (reference potential). Because the potential of the shielding film is kept constant by the source line inversion when averaged temporally, it becomes possible to float the shielding film in the holding capacitor having the structure in which the dielectric is sandwiched between the shielding film and the pixel electrode. Accordingly, it becomes unnecessary to create a contact hole by means of photolithography using a mask through the interlayer insulating film provided between the shielding film and the common line in order to connect the shielding film with the common line. Therefore, it becomes possible to reduce the number of fabrication steps, to achieve the high yield and to suppress the fabrication cost of the active matrix liquid crystal display.

[Fourth Embodiment]

Figure 16:
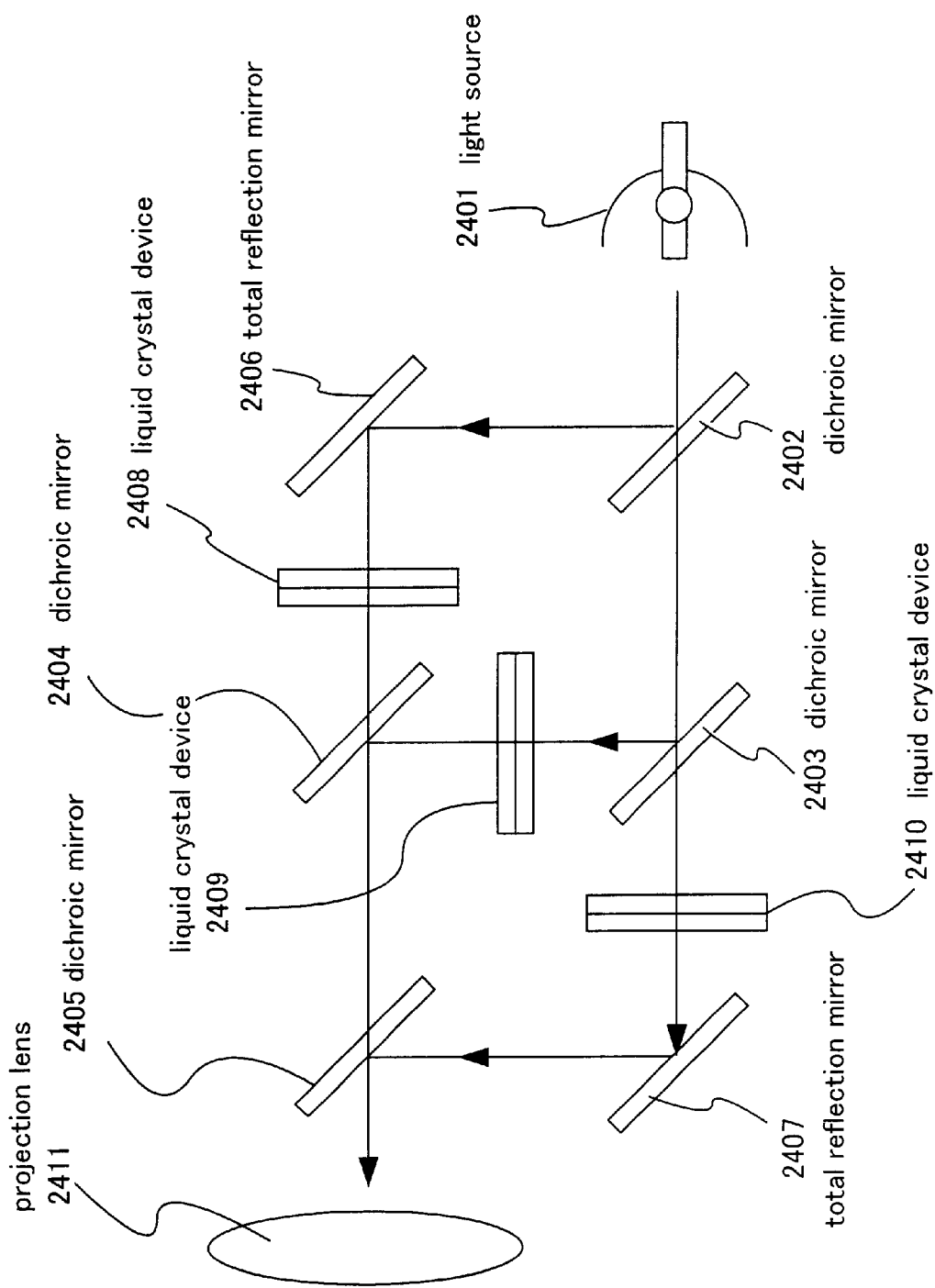
FIG. 16 is a schematic structural view of a three-plate type projector using an inventive liquid crystal display.

The inventive liquid crystal display explained in the first through third embodiments maybe used for a three-plate type projector as shown in FIG. 16.

In FIG. 16, the reference numeral (2401) denotes a white light source, (2402 through 2405) dichroic mirrors, (2406 and 2407) total reflection mirrors, (2408 through 2410) liquid crystal displays of the invention and (2411) a projector lens.

[Fifth Embodiment]

Figure 17:
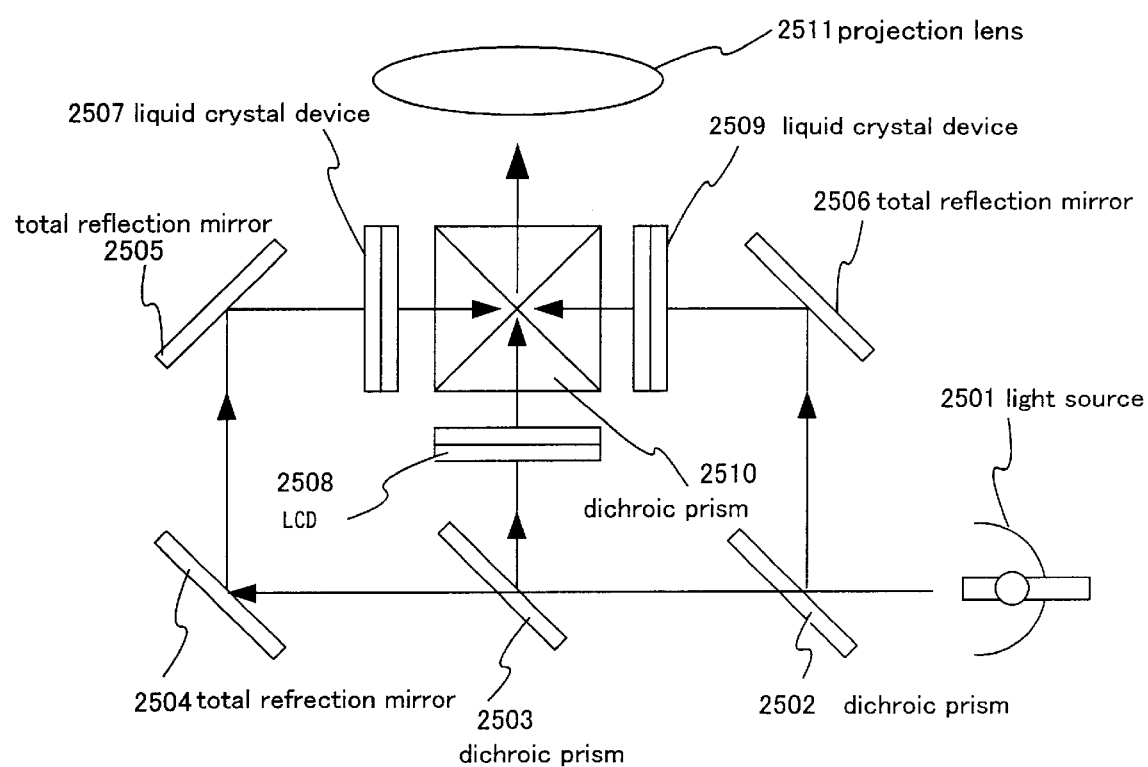
FIG. 17 is a schematic structural view of a three-plate type projector using the inventive liquid crystal display.

The inventive liquid crystal display explained in the first through third embodiments may be used also for a three-plate type projector as shown in FIG. 17.

In FIG. 17, the reference numeral (2501) denotes a white light source, (2502 through 2503) dichroic mirrors, (2504 and 2506) total reflection mirrors, (2507 through 2509) liquid crystal displays of the invention, (2510) a dichroic prism and (2511) a projector lens.

[Sixth Embodiment]

Figure 18:
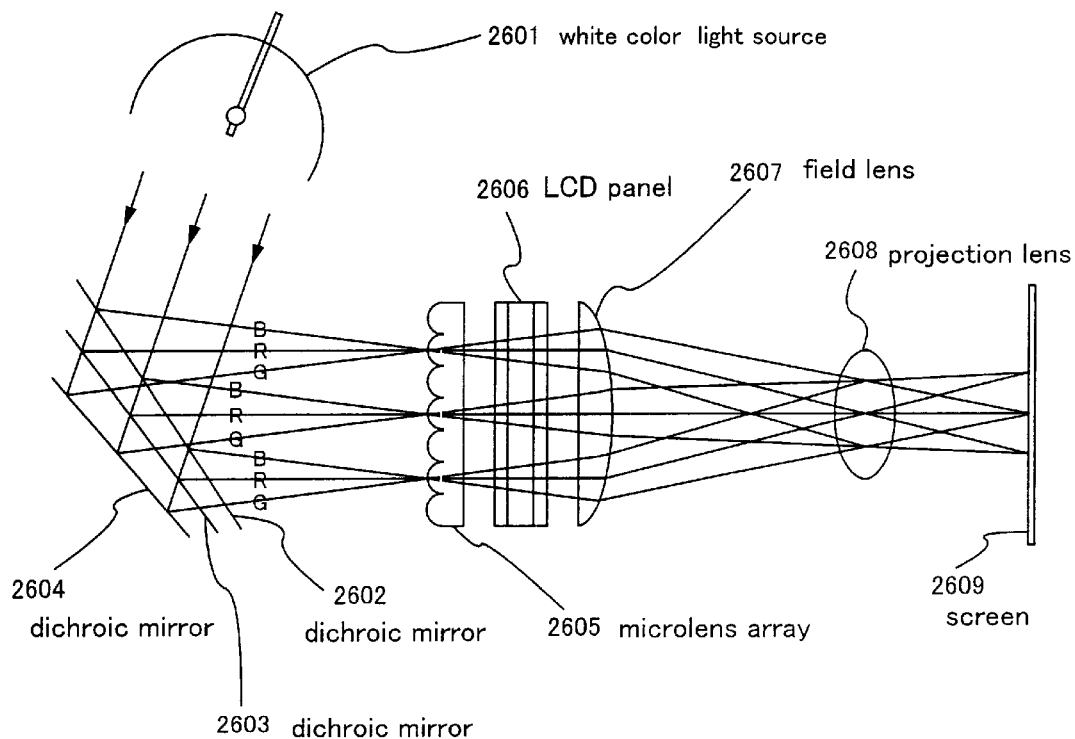
FIG. 18 is a schematic structural view of a single-plate type projector using the inventive liquid crystal display.

The inventive liquid crystal display explained in the first through third embodiments may be used also for a single-plate type projector as shown in FIG. 18.

In FIG. 18, the reference numeral (2601) denotes a white light source composed of a lamp and a reflector, (2602, 2603 and 2604) dichroic mirrors for selectively reflecting light in the wavelength ranges of blue, red and green, respectively, (2605) a micro-lens array comprising a plurality of micro-lenses, (2606) a liquid crystal display of the invention, (2607) a field lens, (2608) a projector lens and (2609) a screen.

[Seventh Embodiment]

Among the projectors in the fifth through seventh embodiments, there are a rear projector and a front projector depending on its projecting method.

Figure 19A:
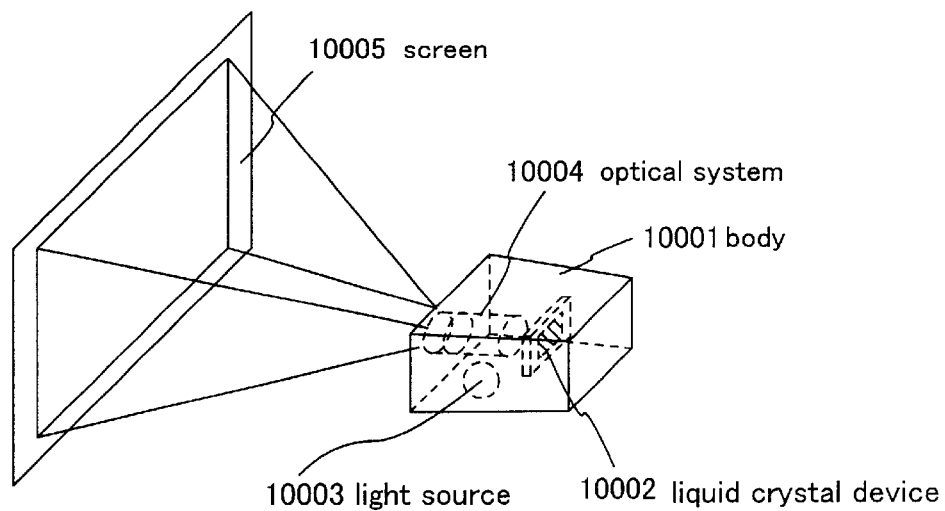
FIGS. 19A and 19B are schematic structural views of a front projector and a rear projector using the inventive liquid crystal display.

FIG. 19A shows the front type projector comprising a main body 10001, a liquid crystal display 10002 of the invention, a light source 10003, an optical system 10004 and a screen 10005. It is noted that although FIG. 19A shows the front projector in which the liquid crystal display is built in, a front type projector of higher resolution and higher precision may be realized by combining three liquid crystal displays (corresponding to light of R, G and B, respectively).

Figure 19B:
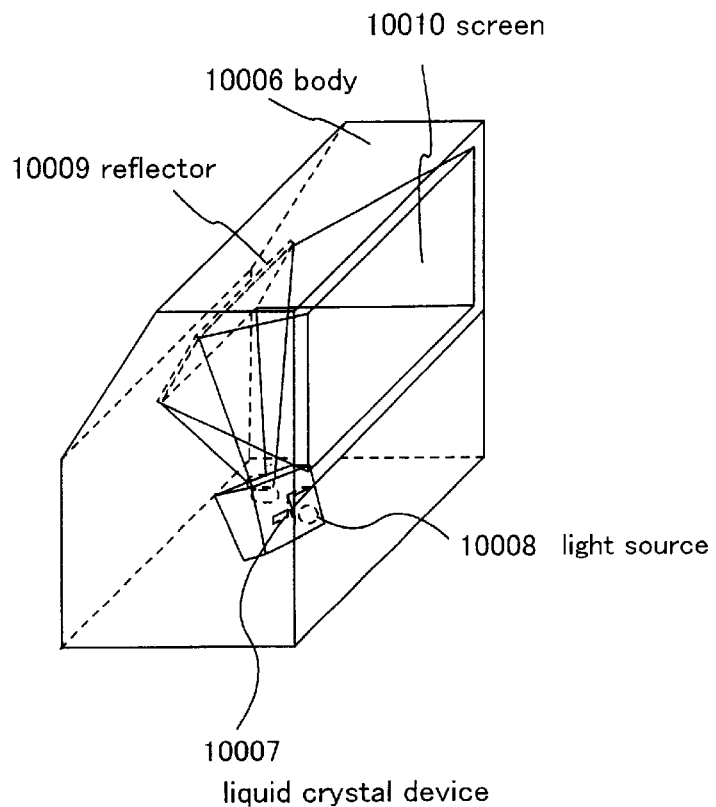

FIG. 19B shows the rear type projector comprising a main body 10006, a liquid crystal display 10007 of the invention, a light source 10008, a reflector 10009 and a screen 10010. FIG. 19B shows the rear projector in which three active matrix type liquid crystal displays are built in (corresponding to light of R, G and B, respectively).

[Eighth Embodiment]

An example in which the inventive liquid crystal display is used for a goggle type display will be explained in the present embodiment.

Figure 20:
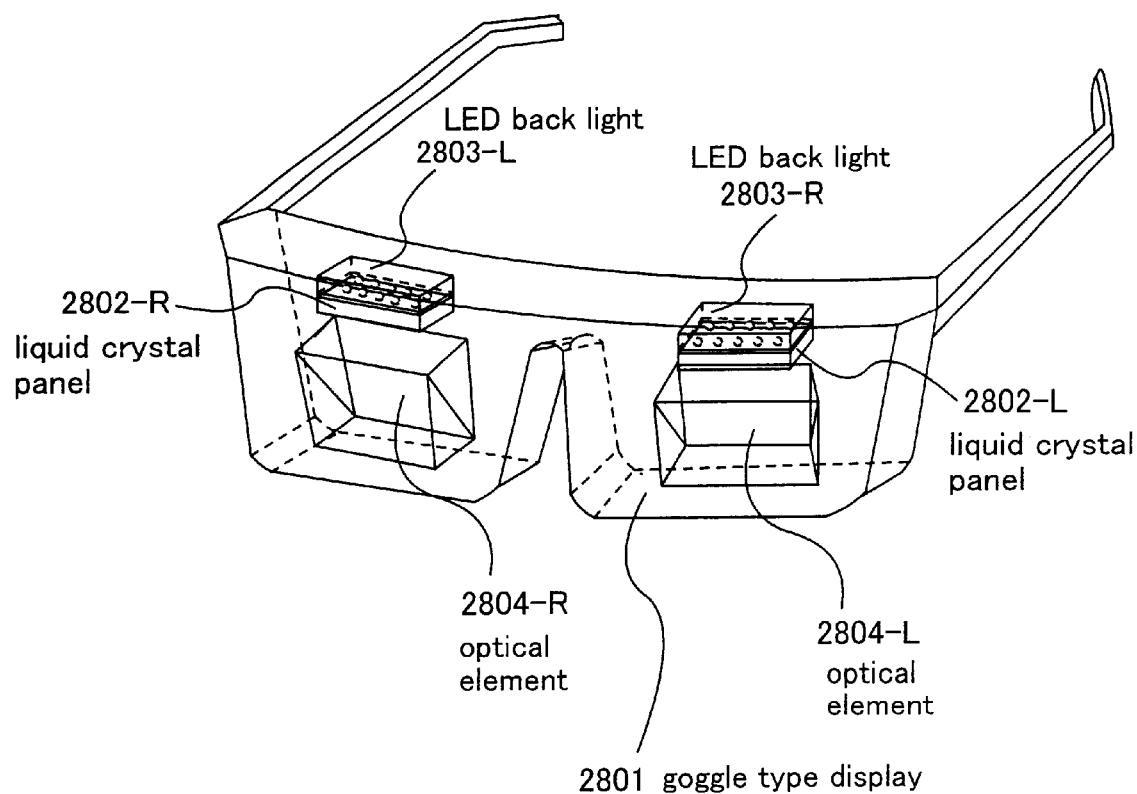
FIG. 20 is a schematic structural view of a goggle type display using the inventive liquid crystal display.

In FIG. 20, the reference numeral (2801) denotes a main body of the goggle type display, (2802-R and 2802-L) the inventive liquid crystal displays, (2803-R and 2803-L) LED back lights, and (2804-R and 2804-L) optical elements.

[Ninth Embodiment]

Besides those described above, the inventive liquid crystal display may be used variously. A semiconductor device in which the inventive liquid crystal display is built in will be explained in the present embodiment.

Such semiconductor device includes a video camera, a still camera, a car-navigation system, a personal computer, a portable information terminal (mobile computer, portable phone and others) and others. FIGS. 21A through 21D show example of them.

FIG. 21A shows a portable phone comprising a main body 11001, a speech output section 11002, a speech input section 11003, an inventive liquid crystal display 11004, control switches 11005 and an antenna 11006.

FIG. 21B shows a video camera comprising a main body 12007, an inventive liquid crystal display 12008, a sound input section 12009, control switches 12010, a battery 12011 and an image receiving section 12012.

FIG. 21C shows a mobile computer comprising a main body 13001, a camera section 13002, an image receiving section 13003, a control switch 13004 and an inventive liquid crystal display 13005.

FIG. 21D shows a portable book (electronic book) comprising a main body 14001, inventive liquid crystal displays 14002 and 14003, a storage medium 14004, control switches 14005 and an antenna 14006.

[Tenth Embodiment]

Figure 22:
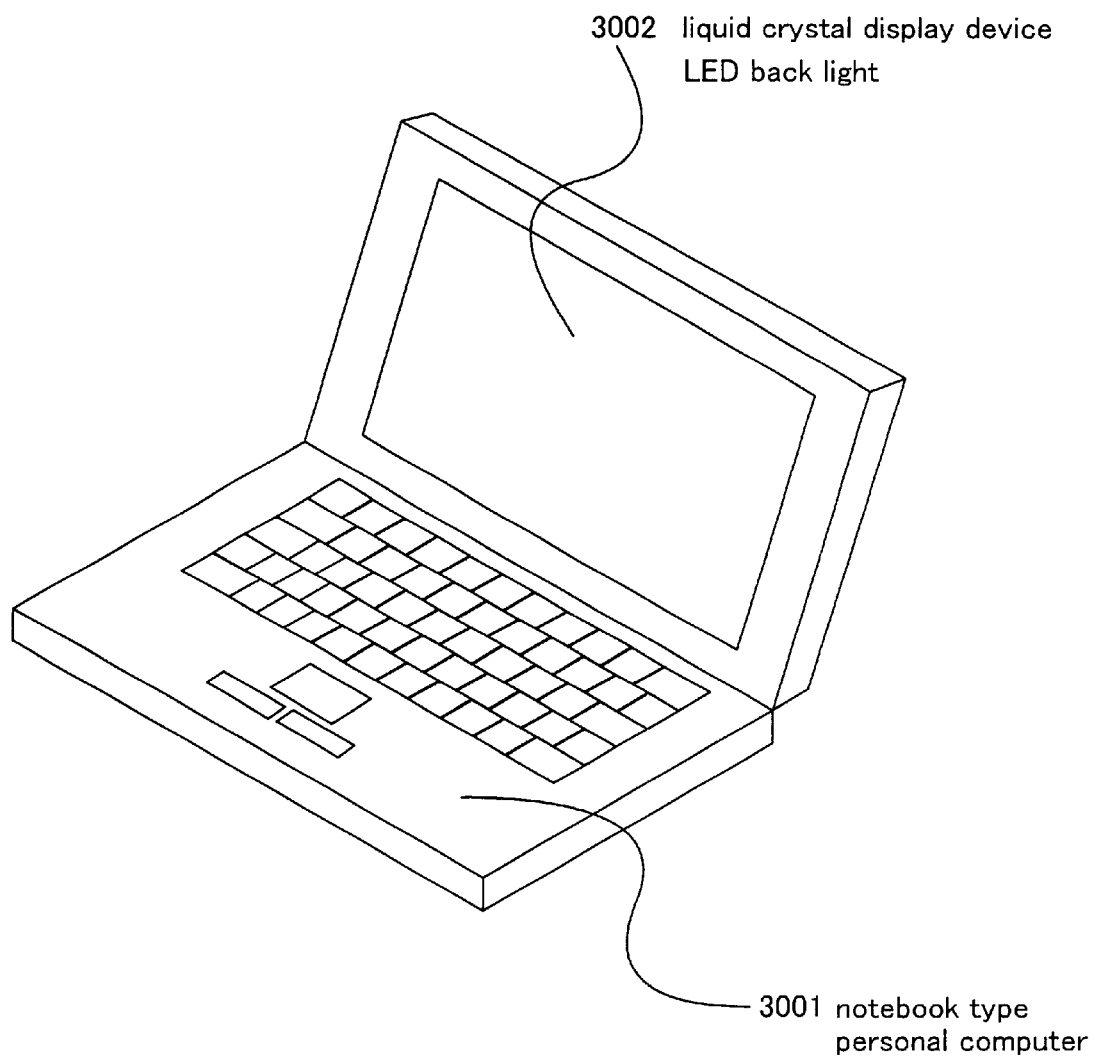
FIG. 22 is a schematic structural view of a notebook type personal computer using the inventive liquid crystal display.

FIG. 22 shows an example in which the inventive liquid crystal display is used in a notebook type personal computer.

The notebook type personal computer comprises a main body 3001 and a liquid crystal display 3002 of the invention. LED is used for backlight. It is noted that a cathode ray tube may be also used for backlight.

[Eleventh Embodiment]

A case of providing the shielding film not only on the active matrix substrate having the active matrix section but also on an opposed substrate will be explained in the present embodiment.

Figure 24A:
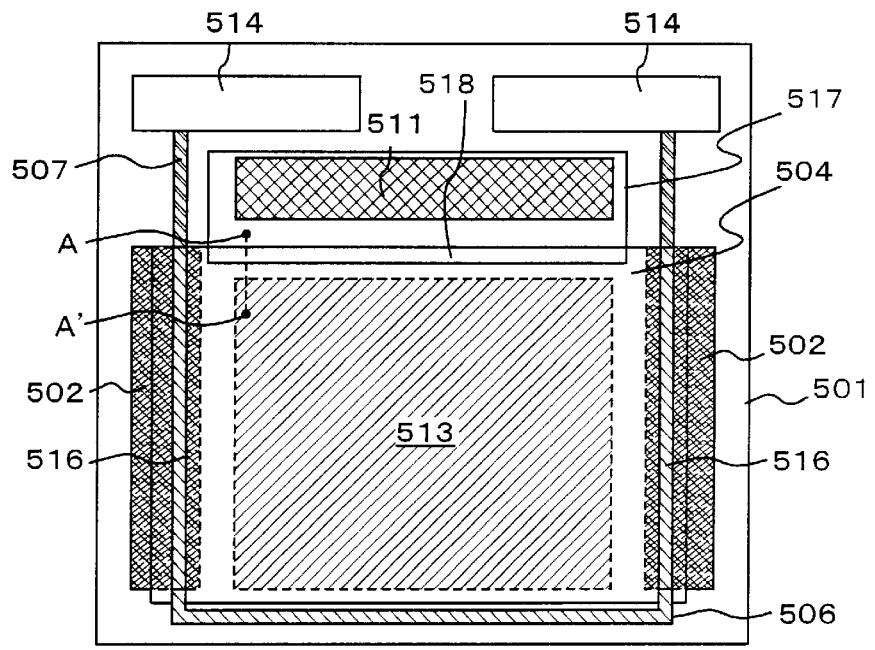
FIGS. 24A and 24B are section and plan views of another inventive active matrix circuit.

A substrate (active matrix substrate) 501, a source signal line driving circuit 511, a gate signal line driving circuit 502, an active matrix section 513, a shielding film 504, an ITO film 506, a common line 507 and FPC 514 are provided as shown in FIG. 24A. An opposed shielding film 517 provided on the opposed substrate overlaps with the whole source signal line driving circuit 511 as shown in the figure and overlaps with a part of the shielding film 504. Although the opposed shielding film 517 has been provided on the opposed substrate so that it overlaps with the whole source signal line driving circuit 511 in the present embodiment, it may be arranged so as to overlap only with a sampling circuit of the source signal line driving circuit 511.

The ITO film 506 is electrically connected with the common line 507 and the common line 507 is connected to the outside of the substrate by the FPC 514 to keep its potential constant (reference potential).

A coupling capacitor 516 is formed at the part where the ITO film 506 connected to the common line 507 overlaps with the shielding film 504.

The part (overlap section) 518 where the opposed shielding film 517 overlaps with the shielding film 504 prevents light from the outside from entering the source signal line driving circuit 511. When light enters the source signal line driving circuit 511, or the sampling circuit of the source signal line driving circuit 511 in particular, OFF current of a thin film transistor (TFT) composing the sampling circuit increases, thus causing noises. Preferably, the opposed shielding film 517 contains Ti. Ti prevents light from entering the source signal line driving circuit 511 by being reflected by the opposed shielding film 517. While the overlap section 518 is provided by 20 $\mu$m or more, it is effective in preventing light from entering the source signal line driving circuit 511.

Figure 24B:
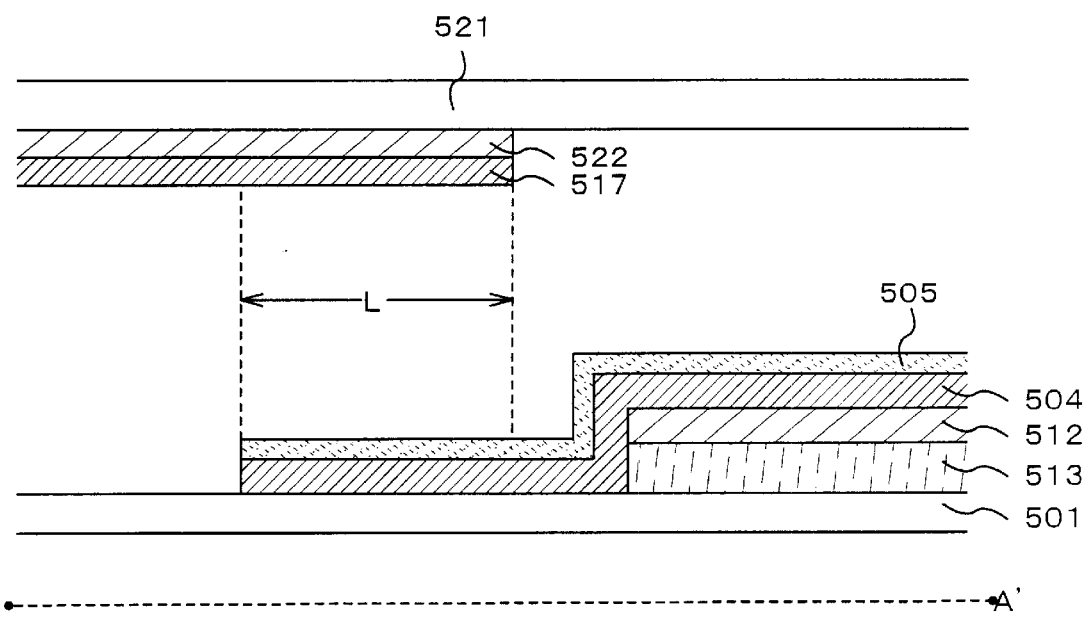

FIG. 24B shows a section view along A–A' in FIG. 24A. The substrate 501, the active matrix section 513, the interlayer insulating film 512, the shielding film 504, dielectric 505, the opposed substrate 521, an opposed substrate side interlayer insulating film 522 and the opposed substrate side shielding film 517 are provided as shown in the figure. The substrate 501 is bonded with the opposed substrate 521 by a sealing member (not shown) while interposing a spacer (not shown). While the shielding film 504 overlaps partially with the opposed substrate side shielding film 517, the width L of this overlap is preferable to be 20 $\mu$m or more.

The driver circuit and the active matrix circuit may be formed in the same manner as in the preceding embodiment or the following embodiment.

[Twelfth Embodiment]

Besides the method shown in the first embodiment, one example of the method for fabricating the inventive TFTs of the pixel matrix circuit and the driver circuits provided around it in the same time will be explained with reference to FIG. 29. It is noted that the method for fabricating the present invention is not limited to this fabrication method.

The device is formed in the same manner with the first embodiment up to the step shown in FIG. 8C. Next, the first and second conductive films (handled as a laminated layer hereinbelow) are etched by using resist masks to form a gate electrode 8001 of the p-channel type TFT and a gate electrode 8002, gate signal lines 8003a and 8003b of the n-channel type TFT. At this time, the gate electrode 8002 is formed so as to overlap with the n⁻ regions 6012 and 6013 via a gate insulating film (FIG. 29A).

Then, impurity element giving the n-type was doped by using the gate electrode 8001 of the p-channel type TFT, the gate electrode 8002 and the gate signal line 8003a and 8003b of the n-channel type TFT as masks. Phosphorus of the same or less concentration with the n⁻ region ($5 \times 10^{16}$ to $1 \times 10^{18}$ atoms/cm³ in concrete) mentioned in FIG. 8B was doped to the impurity regions 8004 through 8008 thus formed. It is noted that the concentration of the impurity element contained in the impurity regions 8004 through 8008 formed here and giving the n-type will be denoted as a (n⁻⁻) region. Accordingly, the impurity regions 8004 through 8008 may be said as the n⁻⁻ regions in the present specification. Although the phosphorus is doped to all of the impurity regions except of impurity regions 8009 and 8010 hidden by the gate electrode with the concentration of n⁻ in this process, it may be neglected because its concentration is very low (FIG. 29B).

Next, resist masks 8011 through 8014 were formed. Then, a step of forming an impurity region which functions as a source region or a drain region in the n-channel type TFT was carried out. The resist mask 8012 was formed so as to cover the gate electrode 8002 of the n-channel type TFT in order to form an LDD region so as not to overlap with the gate electrode in the n-channel type TFT of the pixel matrix circuit in the later step.

Then, impurity regions 8016 through 8022 were formed by doping the impurity element giving the n-type. Here, phosphorus was doped by means of ion doping (ion implantation may be also used of course) by using phosphine (PH₃) also here. Here, phosphorus was doped with concentration of $1 \times 10^{20}$ to $1 \times 10^{21}$ atoms/cm³. It is noted that the concentration of the impurity element contained in the impurity regions 8018 through 8022 formed here and giving the n-type will be denoted as (n⁺). Accordingly, the impurity regions 8018 through 8022 may be said as n⁺ regions. Further, because the n⁻ region had been already formed, the impurity regions 8009 and 8010 contain phosphorus with the concentration a little higher than the impurity regions 8020 through 8022 more or less (FIG. 29C).

It is noted that the process of doping the impurity element giving the n-type may be carried out after etching the gate insulating film 6007 by using the resist masks 8011 through 8014 as masks and by exposing the part of the island semiconductor layers 6005 and 6006. In this case, the island semiconductor film is less damaged and the throughput may be improved because the accelerating voltage may be low.

A resist mask 8024 was formed so as to cover the whole surface of the region which turns out to be the n-channel type TFT. Then, a process of doping impurity elements which give p-type at part of the semiconductor layer 6004 where the p-channel type TFT is to be formed was carried out with resist mask 8024 used as a mask. Here, boron was doped as the impurity element by means of ion doping (ion implantation may be also used of course) by using diboran (B₂H₆). Here, boron was doped with concentration of $5 \times 10^{20}$ to $3 \times 10^{21}$ atoms/cm³. It is noted that the concentration of the impurity element contained in the impurity region formed here and giving the p-type will be denoted as (P⁺). Accordingly, the impurity regions 8025 and 8026 may be said as P⁺ regions (FIG. 29D).

It is noted that the process of doping the impurity element giving the p-type may be carried out after etching the gate insulating film 6007 by using the resist mask 8024 to expose the part of the island semiconductor layer 6004. In this case, the island semiconductor film is less damaged and the throughput may be improved because the accelerating voltage may be low.

Next, a step for activating the doped impurity element (phosphorus or boron) is carried out. Preferably, this activating process is carried out by means of furnace annealing or lamp annealing in the present embodiment. When the furnace annealing is used, a heat treatment is carried out in 450 to 650° C. or more preferably in 500 to 550° C. or here at 500° C. of four hours (FIG. 29E).

In case of the present embodiment, there always exists a region containing certain concentration of phosphorus equivalent to that of the n⁺ region in the source or drain region of the both n-channel type TFT and p-channel type TFT. Therefore, it is possible to obtain a nickel gettering effect by phosphorus in the heat treatment step for the thermal activation. That is, nickel moves in the direction indicated by an arrow from the channel forming region and is gettered by the action of phosphorus contained in the source or drain region. This is particularly advantageous in the case that the silicon film is crystallized by utilizing a crystallization promoting metal such as nickel.

The present embodiment is effective in simplifying the process because the step for activating the impurity element doped to the island semiconductor film may be combined with the step for gettering the catalyst element used for crystallization.

Then, the TFTs of the pixel matrix circuit and the driver circuits provided around that are completed through the same process shown in FIG. 10C as described in the first embodiment. It is noted that the present embodiment shows mere examples of the fabrication processes and the sequence of the fabrication processes is not limited to the mode of the present embodiment.

[Thirteenth Embodiment]

Figure 30A:
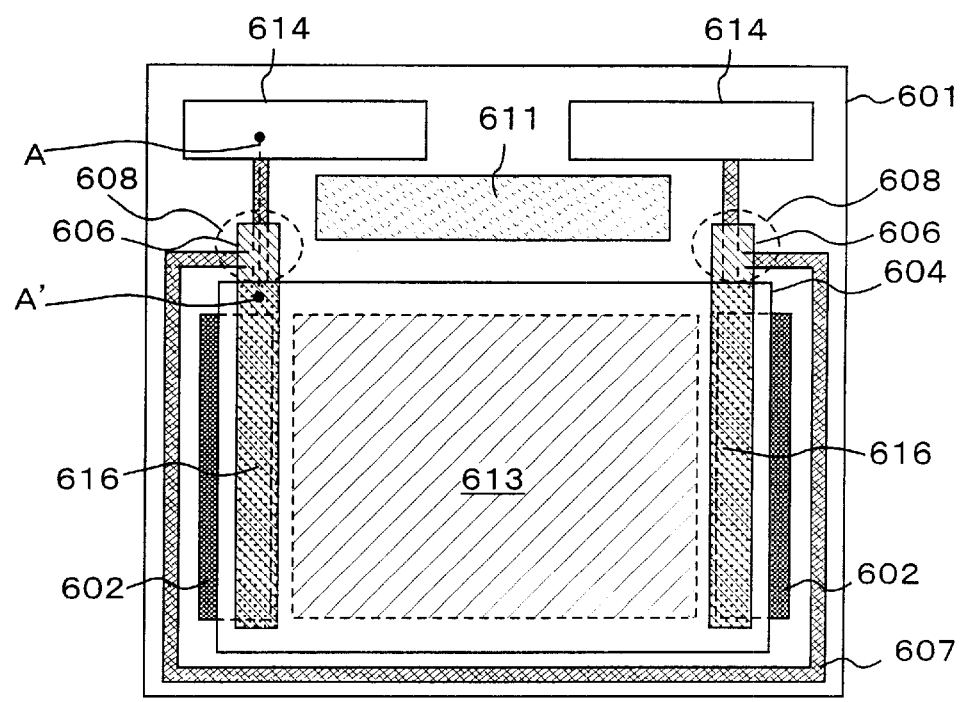
FIGS. 30A and 30B are section and plan views of the inventive active matrix circuit.
Figure 30B:
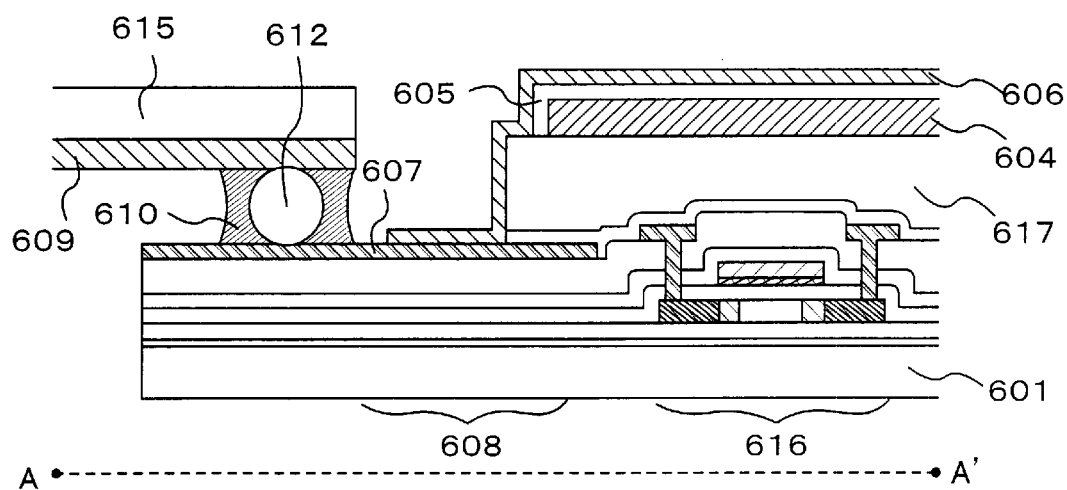

An example which is different from what shown in FIGS. 23A and 23B, i.e., section and plan views of the inventive active matrix circuit, will be explained in the present embodiment. FIGS. 30A and 30B are schematic plan and section views of the circuit shown in FIG. 11. FIG. 30A is a plan view of the inventive active matrix circuit.

A source signal line driving circuit 611 (301 in FIG. 11), a gate signal line driving circuit 602 (302 in FIG. 11), an active matrix section 613 (303 in FIG. 11), a shielding film 604, an ITO film 606, a common line 607 an FPC 614 are provided as shown in FIG. 30A.

The ITO film 606 is electrically connected with the common line 607 at a connecting section 608 and the common line 607 is connected to the outside of the substrate by the FPC 614 to be kept at constant potential (reference potential).

The coupling capacitor 616 (310 in FIG. 11) is formed at the part where the ITO film 606 connected to the common line 607 overlaps with the shielding film 604. Because the ITO film 606 is formed so as to cover the part of the gate signal line driving circuit 602 in the present embodiment, it is possible to form the coupling capacitor 616 having a large capacity. The ITO film 606 may be formed so as to cover the whole gate signal line driving circuit 602.

FIG. 30B is a section view along A–A' in FIG. 30A. A substrate 601, one of n-channel type TFT 616 of the gate signal line driving circuit 602, an interlayer insulating film 617, the shielding film 604, dielectric 605, the ITO film 606, a common line 607 (312 in FIG. 11), a filler 612, resin 610, an ITO film 609 formed on the lead terminal from the FPC and a lead terminal 615 from the FPC are provided as shown in FIG. 30B.

The coupling capacitor is formed by the shielding film 604, the ITO film 606 and the dielectric 605 sandwiched therebetween. The ITO film 606 is provided on the gate signal line driving circuit 602. In other words, it is provided on one of the n-channel type TFT 616 of the gate signal line driving circuit 602.

The ITO film 606 is connected with the common line 607 provided on the substrate 601 at the connecting section 608. It is noted that although the ITO film 606 is connected directly with the common line 607 in the present embodiment, the ITO film 606 may be connected electrically with the common line 607.

The FPC side ITO film 609 is formed on the lead terminal 615 from the FPC in contact therewith and the FPC side ITO film 609 on the lead terminal 615 from the FPC is connected with the ITO film 606 by the filler 612 and the resin 610.

The resin 610 may be photo-setting resin, thermo-setting resin or a mixture of the photo-setting and thermo-setting resins. When the mixture of the photo-setting resin and the thermo-setting resin is used, they are connected by heating and pressing after adhering temporarily by light. The filler must be a conductive material. Two or more fillers having different sizes may be used. In this case, the smaller filler needs not be conductive because it functions as a spacer and the larger filler must be conductive because it connects them electrically. The active matrix circuit and the driver circuit may be fabricated in the same manner as the method disclosed in any one of the preceding embodiments.

[Fourteenth Embodiment]

In the present embodiment, one example of the electro-optic apparatus using the present invention, besides those shown in FIGS. 16 through 22, will be explained with reference to FIG. 31.

Figure 31A:
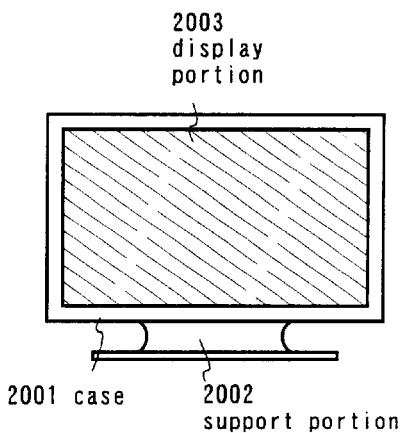
FIGS. 31A through 31C show examples of electronic apparatus using the inventive liquid crystal display.

FIG. 31A shows a display comprising a case 2001, a support 2002, a display section 2003 and others. The present invention may be applied to the display section 2003.

Figure 31B:
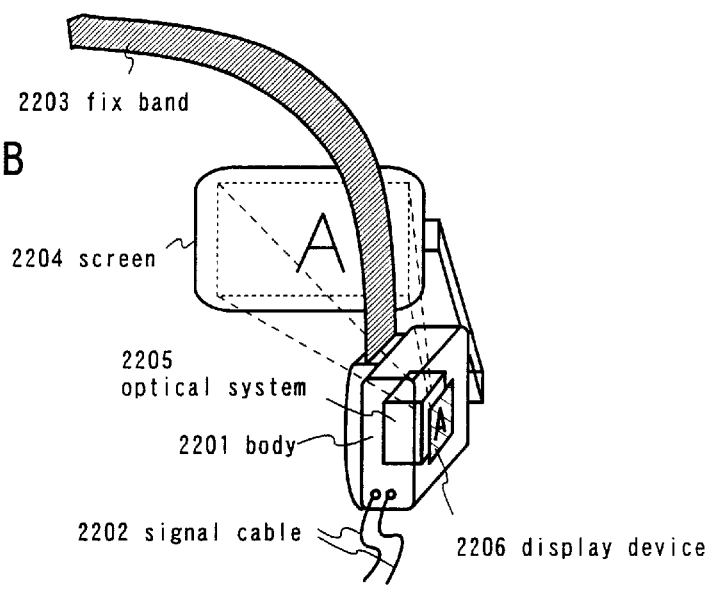

FIG. 31B shows a part (right side) of a head mounting display comprising a main body 2201, a signal cable 2202, a head fixing band 2203, a screen 2204, an optical system 2205, a display portion 2206 and others. The present invention may be applied to the display portion 2206.

Figure 31C:
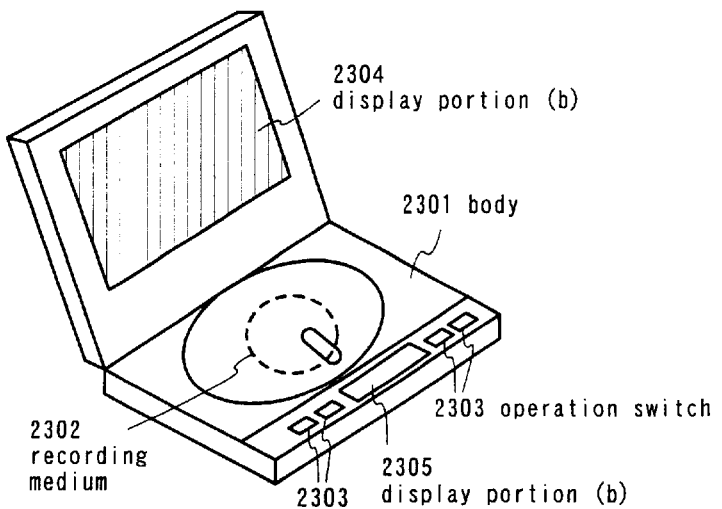

FIG. 31C is a player using a recording medium in which programs are recorded, comprising a main body 2301, a recording medium 2302, control switches 2303, a display section 2304 and others. It is noted that this apparatus allows the user to enjoy music and movies or to connect to Internet by using a DVD (Digital Versatile Disc), a CD and the like as the recording medium.

As described above, the applicable range of the present invention is extremely wide and the invention may be applied to electronic apparatuses of all kinds of fields. Further, the electronic apparatuses of the present embodiment may be realized by using any arrangement composed of the first through third embodiments and of the eleventh through thirteenth embodiments.

As described above, according to the present invention, the liquid crystal is driven by the source line inversion and the shielding film is put into the floating condition without connecting to the common line. Because the potential of the shielding film is kept constant when averaged temporally without connecting the shielding film to the common line by arranging as described above, it becomes possible to form the holding capacitor having the structure in which the dielectric is sandwiched between the shielding film and the pixel electrode. Accordingly, it becomes unnecessary to create a contact hole by means of photolithography using a mask through the interlayer insulating film provided between the shielding film and the common line in order to connect the shielding film with the common line. Therefore, it becomes possible to reduce the number of fabrication steps, to achieve the high yield and to suppress the fabrication cost of the active matrix liquid crystal display. In addition to that, the potential of the shielding film may be kept more constant when the shielding film is put into the floating condition and the large capacity coupling capacitor is formed between the shielding film and the common line, so that a better contrast may be obtained.

While the preferred embodiments have been described, variations thereto will occur to those skilled in the art within the scope of the present inventive concepts which are delineated by the following claims.

A silicon film is used in the foregoing preferred embodiments. It is to be understood that another semiconductor material, for example, silicon-germanium compound may be used instead of silicon.

Also, although the thin film transistors disclosed in the preferred embodiments are so called multi-gate transistors, it is to be understood that single-gate type transistors may be used. Further, other types of thin film transistors, for example, a bottom gate type thin film transistor may be utilized in the present invention. Moreover, the present invention may be applied to an active matrix display panel having amorphous silicon TFTs for switching pixels.

In the foregoing embodiments, it is preferable to form the ITO film of the coupling capacitor simultaneously as the formation of the pixel electrodes in order to reduce a number of photolithography steps. However, if necessary, the electrode for the coupling capacitor may be formed with a different material separately from the pixel electrodes. Also, it is to be understood that other transparent conductive materials such as indium zinc oxide may be used instead of ITO.

What is claimed is:

1. An active matrix type display device comprising:
   a substrate;
   a plurality of pixel TFTs formed over the substrate;
   a plurality of pixel electrodes electrically connected to said plurality of pixel TFTs;
   a shielding film formed over said substrate wherein said shielding film is electrically floating; and
   a dielectric interposed between said pixel electrodes and said shielding film; and
   a plurality of holding capacitors wherein said holding capacitors comprise the plurality of pixel electrodes and the shielding film with the dielectric interposed therebetween.

2. An active matrix type display device comprising:
   a substrate;
   a plurality of source signal lines and a plurality of gate signal lines formed over the substrate;
   a plurality of pixel TFTs formed over the substrate;
   a plurality of pixel electrodes electrically connected to said plurality of pixel TFTs;
   a shielding film formed over said substrate wherein said shielding film is electrically floating; and
   a dielectric interposed between said pixel electrodes and said shielding film,
   wherein signals whose polarity is inverted per each of said plurality of source signal lines are applied to said source signal lines and the polarity of said signal applied to the respective one of said plurality of source signal lines is inverted per one frame period.

3. An active matrix type liquid crystal display device comprising:
   a first substrate;
   a plurality of source signal lines and a plurality of gate signal lines formed over the first substrate;
   a plurality of pixel TFTs formed over the first substrate, each of said pixel TFTs comprising an active layer including source and drain regions and a channel formation region, a gate electrode adjacent to said channel formation region with a gate insulating film interposed therebetween wherein the gate electrode is connected to corresponding one of the gate signal lines;
   a plurality of pixel electrodes electrically connected to said plurality of pixel TFTs;
   a shielding film formed over the first substrate wherein said shielding film is electrically floating;
   a dielectric interposed between said pixel electrodes and said shielding film;
   a second substrate opposed to said first substrate;
   a liquid crystal interposed between said first and second substrates;
   wherein signals whose polarity is inverted per each of said plurality of source signal lines are applied to said source signal lines and the polarity of said signal applied to the respective one of said plurality of source signal lines is inverted per one frame period.

4. An active matrix type liquid crystal display device comprising:
   a first substrate;
   a plurality of source signal lines and a plurality of gate signal lines formed over the first substrate;
   a plurality of pixel TFTs formed over the first substrate, each of said pixel TFTs comprising an active layer including a pair of first impurity regions, a channel formation region between said first impurity regions, at least one second impurity region between the channel formation region and the first impurity regions, a gate electrode adjacent to said channel formation region with a gate insulating film interposed therebetween wherein the gate electrode is connected to corresponding one of the gate signal lines;
   a plurality of pixel electrodes electrically connected to said plurality of pixel TFTs;
   a shielding film formed over the first substrate wherein said shielding film is electrically floating;
   a dielectric interposed between said pixel electrodes and said shielding film;
   a second substrate opposed to said first substrate;
   a liquid crystal interposed between said first and second substrates;
   wherein said second impurity region is overlapped with said gate electrode with the gate insulating film therebetween, and signals whose polarity is inverted per each of said plurality of source signal lines are applied to said source signal lines, and the polarity of said signal applied to the respective one of said plurality of source signal lines is inverted per one frame period.

5. The display device according to any one of claims 1 through 4, wherein said dielectric is an anode oxide film formed by anodizing said shielding film.

6. The display device according to any one of claims 1 through 4, wherein said shielding film comprises a metal selected from the group consisting of aluminum (Al), titanium (Ti) and tantalum (Ta).

7. The display device according to any one of claims 1 through 4, wherein a thickness of said shielding film is 100 to 300 nm.

8. The display device according to claim 3 or 4 wherein said gate electrode comprises a metal selected from the group consisting of titanium (Ti), tantalum (Ta), tungsten (W) and molybdenum (Mo).

9. A rear projector having three liquid crystal panels wherein each of the panels is the display device according to any one of claims 1 through 4.

10. A front projector having three liquid crystal panels wherein each of the panels is the display device according to any one of claims 1 through 4.

11. A rear projector having a single liquid crystal panel wherein the liquid crystal panel is the display device according to any one of claims 1 through 4.

12. A goggle type display device having two display panels wherein each of the display panels is the display device according to any one of claims 1 through 4.

13. The display device according to any one of claims 1 through 4 further comprising a coupling capacitor formed between the shielding film and an electrode wherein said electrode is formed simultaneously as the pixel electrodes.

14. An active matrix type display device comprising:
a substrate;
a plurality of pixel electrodes formed over a display portion of the substrate;
a plurality of thin film transistors for switching said pixel electrodes;
a shielding film formed over the substrate wherein said shielding film is electrically floating;
a plurality of holding capacitors wherein said holding capacitors comprise the plurality of pixel electrodes and the shielding film with the dielectric interposed therebetween;
a common line connected to a fixed voltage over the substrate;
a first dielectric interposed between said shielding film and said pixel electrodes; and
a second dielectric interposed between said shielding film and said common line,
wherein said second dielectric does not overlap the display portion.

15. An active matrix type display device comprising:
a substrate;
a plurality of pixel electrodes formed over a display portion of the substrate;
a plurality of source signal lines and a plurality of gate signal lines formed over the substrate;
a plurality of pixel TFTs for switching said pixel electrodes;
a shielding film formed over said substrate wherein said shielding film is electrically floating;
a common line electrically connected to a fixed voltage formed over the substrate;
a first dielectric interposed between said pixel electrodes and said shielding film,
a second dielectric interposed between the shielding film and the common line;
wherein signals whose polarity is inverted per each of said plurality of source signal lines are applied to said source signal lines and the polarity of said signal applied to the respective one of said plurality of source signal lines is inverted per one frame period,
wherein said second dielectric does not overlap the display portion.

16. An active matrix type display device comprising:
a first substrate;
a plurality of pixel electrodes formed over a display portion of the first substrate;
a plurality of source signal lines and a plurality of gate signal lines formed over the first substrate;
a plurality of pixel TFTs for switching said pixel electrodes, each of said pixel TFTs comprising an active layer including source, drain and channel regions, and a gate electrode adjacent to the channel region with a gate insulating film interposed therebetween wherein said gate electrode is electrically connected to corresponding one of the gate signal lines;
a shielding film formed over said first substrate wherein said shielding film is electrically floating;
a common line electrically connected to a fixed voltage formed over the first substrate;
a first dielectric interposed between said pixel electrodes and said shielding film,
a second dielectric interposed between the shielding film and the common line;
a second substrate opposed to said first substrate; and
a liquid crystal interposed between the first and second substrates,
wherein signals whose polarity is inverted per each of said plurality of source signal lines are applied to said source signal lines and the polarity of said signal applied to the respective one of said plurality of source signal lines is inverted per one frame period, and
wherein said second dielectric does not overlap the display portion.

17. An active matrix type display device comprising:
a first substrate;
a plurality of pixel electrodes formed over a display portion of the first substrate;
a plurality of source signal lines and a plurality of gate signal lines formed over the firs substrate;
a plurality of pixel TFTs for switching said pixel electrodes, each of said pixel TFTs comprising an active layer including first impurity regions, a channel region interposed between the first impurity regions and at least one second impurity region between the channel region and the first impurity region, and a gate electrode adjacent to the channel region with a gate insulating film interposed therebetween wherein said gate electrode is electrically connected to corresponding one of the gate signal lines wherein said second impurity region is overlapped with the gate electrode with the gate insulating film interposed therebetween;
a shielding film formed over said first substrate wherein said shielding film is electrically floating;
a common line electrically connected to a fixed voltage formed over the first substrate;
a first dielectric interposed between said pixel electrodes and said shielding film,
a second dielectric interposed between the shielding film and the common line;
a second substrate opposed to said first substrate; and
a liquid crystal interposed between the first and second substrates,
wherein signals whose polarity is inverted per each of said plurality of source signal lines are applied to said source signal lines and the polarity of said signal applied to the respective one of said plurality of source signal lines is inverted per one frame period, and
wherein said second dielectric does not overlap the display portion.

18. An active matrix display device comprising:
a first substrate;
a plurality of pixel electrodes formed over a display portion of the substrate;
a plurality of thin film transistors for switching the pixel electrodes;
a shielding film formed over the first substrate wherein said shielding film is electrically floating;
a common line connected to a fixed voltage over the first substrate;
a source signal line driver circuit formed over the first substrate wherein said source signal line driver circuit includes a sampling circuit;
a first dielectric interposed between the pixel electrodes and the shielding film;

a second dielectric interposed between the shielding film and a conductive layer which is electrically connected to the common line; and a second substrate provided with a counter shielding film, wherein said second dielectric is not overlapped with the display portion, and said counter shielding film overlaps with said sampling circuit and a portion of said shielding film.

19. The display device according to any one of claims 14 through 18 wherein said first dielectric is an anode oxide film formed by anodizing said first shielding film.

20. The display device according to any one of claims 14 through 18 wherein said second dielectric is an anode oxide film formed by anodizing said second shielding film.

21. The display device according to any one of claims 14 through 18 wherein said shielding film comprises a metal selected from the group consisting of aluminum (Al), titanium (Ti) or tantalum (Ta).

22. The display device according to any one of claims 14 through 18 wherein said shielding film has a thickness of 100 to 300 nm.

23. The display device according to any one of claims 14 through 18 wherein said gate electrode comprises a metal selected from titanium (Ti), tantalum (Ta), tungsten (W) and molybdenum (Mo).

24. A rear projector having three liquid crystal panels wherein each of the panels is the display device according to any one of claims 14 through 18.

25. A front projector having three liquid crystal panels wherein each of the panels is the display device according to any one of claims 14 through 18.

26. A rear projector having a single liquid crystal panel wherein the liquid crystal panel is the display device according to any one of claims 14 through 18.

27. A goggle type display device having two display panels wherein each of the display panels is the display device according to any one of claims 14 through 18.

28. The display device according to any one of claims 2 through 4 and 15 through 18, further comprising holding capacitors wherein said holding capacitors comprise the plurality of the pixel electrodes and the shielding film with the dielectric interposed therebetween.

* * * * *